US009324832B1

(12) United States Patent
Baek et al.

(10) Patent No.: US 9,324,832 B1
(45) Date of Patent: Apr. 26, 2016

(54) METHODS OF MANUFACTURING SEMICONDUCTOR DEVICES USING MASKS HAVING VARYING WIDTHS

(71) Applicant: Samsung Electronics Co., Ltd., Suwon-si (KR)

(72) Inventors: Kang-Hyun Baek, Yongin-si (KR); Kwan-Jae Song, Seoul (KR); Jong-Sung Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/856,666

(22) Filed: Sep. 17, 2015

(30) Foreign Application Priority Data

Nov. 17, 2014 (KR) .......................... 10-2014-0159782

(51) Int. Cl.
*H01L 21/3205* (2006.01)
*H01L 29/66* (2006.01)
*H01L 29/06* (2006.01)

(52) U.S. Cl.
CPC ...... *H01L 29/66545* (2013.01); *H01L 29/0653* (2013.01); *H01L 29/66795* (2013.01)

(58) Field of Classification Search
CPC .................. H01L 26/66545; H01L 29/66795; H01L 29/785; H01L 27/0886; H01L 21/823431; H01L 21/823821; H01L 27/0924; H01L 29/6656; H01L 29/6681; H01L 21/845; H01L 21/32139; H01L 27/1211; H01L 21/31144
USPC ............................................ 438/29, 459, 595
See application file for complete search history.

(56) References Cited

U.S. PATENT DOCUMENTS

| 7,859,028 | B2 * | 12/2010 | Ban | ........................ H01L 21/84 257/249 |
|---|---|---|---|---|
| 7,982,258 | B2 | 7/2011 | Kwak | |
| 8,017,485 | B2 | 9/2011 | Cho et al. | |
| 8,076,190 | B2 | 12/2011 | Chen et al. | |
| 8,129,798 | B2 | 3/2012 | Inaba | |
| 8,486,840 | B2 | 7/2013 | Liaw | |
| 8,669,596 | B2 | 3/2014 | Tamaru | |
| 8,691,697 | B2 | 4/2014 | Booth, Jr. et al. | |
| 8,889,500 | B1 * | 11/2014 | Kamineni | ......... H01L 29/66795 257/268 |
| 2007/0072369 | A1 * | 3/2007 | Young | .................... H01L 27/115 438/257 |
| 2010/0163970 | A1 * | 7/2010 | Rakshit | ................. H01L 29/785 257/327 |

(Continued)

FOREIGN PATENT DOCUMENTS

| JP | 2009-295820 | 6/2008 |
|---|---|---|
| KR | 100140485 B1 | 3/1998 |

(Continued)

*Primary Examiner* — Thanh T Nguyen
(74) *Attorney, Agent, or Firm* — Myers Bigel & Sibley, P.A.

(57) ABSTRACT

In a method, a dummy gate layer structure and a mask layer are formed on a substrate. The mask layer is patterned to form masks. Spacers are formed on sidewalls of the mask. A dummy gate mask is formed between the spacers. The dummy gate layer structure is patterned using the dummy gate mask to form dummy gate structures. The dummy gate structure is replaced with a gate structure. When the mask is formed, an initial layout of masks extending in a first direction is designed. An offset bias in a second direction is provided for a specific region of the initial layout to design a final layout having a width in the second direction varying along the first direction. The mask layer is patterned according to the final layout to form the masks having a width varying along the first direction.

20 Claims, 26 Drawing Sheets

(56) References Cited

U.S. PATENT DOCUMENTS

| | | | |
|---|---|---|---|
| 2012/0001266 A1* | 1/2012 | Lim | H01L 29/66545 257/369 |
| 2014/0342537 A1* | 11/2014 | Wu | H01L 29/66795 438/513 |
| 2015/0137262 A1 | 5/2015 | Baek et al. | |
| 2015/0221644 A1 | 8/2015 | Baek et al. | |
| 2015/0364574 A1* | 12/2015 | Kim | H01L 29/66545 257/368 |

FOREIGN PATENT DOCUMENTS

| | | |
|---|---|---|
| KR | 1020150058597 A | 5/2015 |
| KR | 1020150091661 A | 8/2015 |

\* cited by examiner

FIG. 9
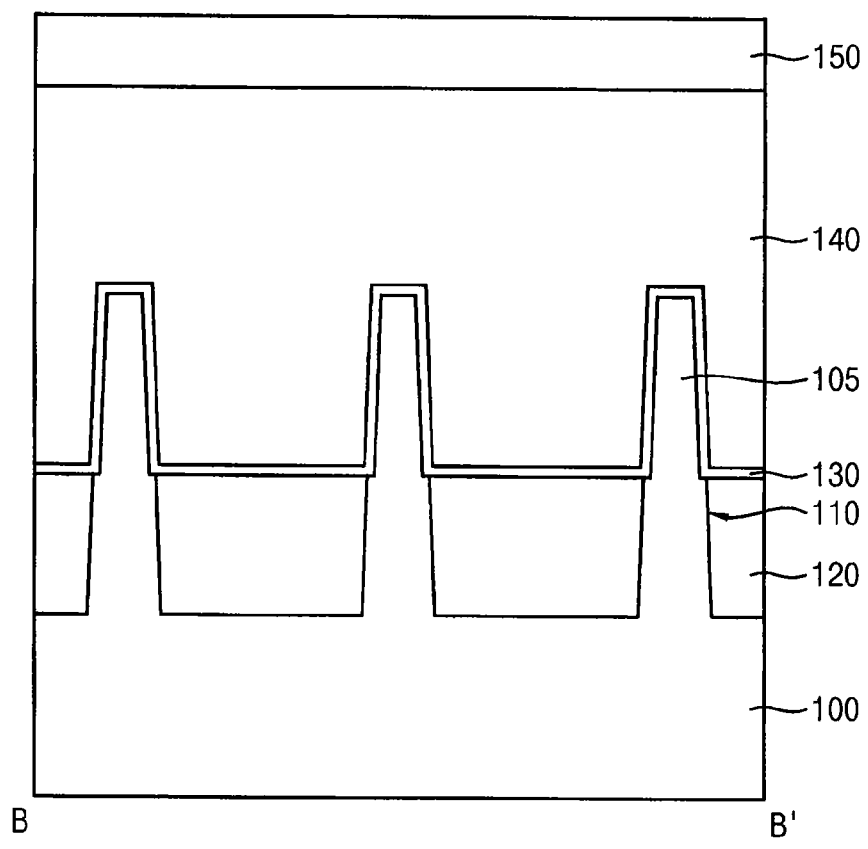
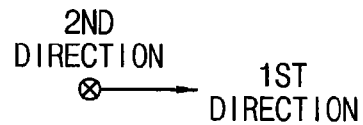

METHODS OF MANUFACTURING SEMICONDUCTOR DEVICES USING MASKS HAVING VARYING WIDTHS

CROSS-REFERENCE TO RELATED APPLICATION

This application claims priority under 35 U.S.C. §119 to Korean Patent Application No. 10-2014-0159782, filed on Nov. 17, 2014 in the Korean Intellectual Property Office, the contents of which are herein incorporated by reference in their entirety.

BACKGROUND

1. Field

Example embodiments relate to methods of manufacturing a semiconductor device. More particularly, example embodiments relate to methods of manufacturing a semiconductor device having fine patterns.

2. Description of the Related Art

A double patterning process may be used to form fine patterns in semiconductor manufacturing operations. In the double patterning process, spacers may be formed on sidewalls of a structure, and an underlying layer may be patterned using the spacers as an etching mask to form fine patterns having a given width. When the fine patterns are required to have different widths at different regions, the spacers have to be, etched using an additional mask.

SUMMARY

Example embodiments provide a method of manufacturing a semiconductor device that includes fine patterns having different widths at different regions.

According to example embodiments, there is provided a method of manufacturing a semiconductor device. In this method, an isolation layer pattern is formed on a substrate to define an active fin protruding from the isolation layer pattern. A dummy gate layer structure and a mask layer are sequentially formed on the active fin and the isolation layer pattern. The mask layer is patterned to form a plurality of masks, each of which extends in a first direction. Spacers are formed on opposed sidewalls of each mask. A dummy gate mask is formed between the spacers. The dummy gate layer structure is patterned using the dummy gate mask as an etching mask to form a plurality of dummy gate structures, each of which extends in the first direction. The dummy gate structure is replaced with a gate structure. When the mask layer is patterned to form the plurality of masks, a plurality of initial mask layouts are designed, each of which extends in the first direction. An offset bias is provided in a second direction that is substantially perpendicular to the first direction for specific regions of respective ones of at least some of the initial mask layouts using a marker to design a plurality of final mask layouts, each having a width in the second direction that varies along the first direction. The mask layer is patterned according to the final mask layouts to form the plurality of masks, each of which has a width in the second direction that varies along the first direction.

In example embodiments, each spacer has a width in the second direction that is constant along the first direction.

In example embodiments, each dummy gate mask has a width in the second direction that varies along the first direction.

In example embodiments, each dummy gate structure has a width in the second direction that varies along the first direction.

In example embodiments, each gate structure has a width in the second direction that varies along the first direction.

In example embodiments, the active fin comprises one of a plurality of active fins, each active fin extending in the second direction so that each dummy gate structure crosses over the plurality of active fins, and a first portion of a first of the dummy gate structures that crosses over a first of the plurality of active fins has a first width in the second direction and a second portion of the first of the dummy gate structures that crosses over a second of the plurality of active fins has a second width in the second direction that is different than the first width.

In example embodiments, when the offset bias is provided for specific regions of respective ones of at least some of the initial mask layouts to design the plurality of final mask layouts, a positive offset bias in the second direction may be provided for first regions of at least some of the initial mask layouts to design the plurality of final mask layouts, each having a width in the second direction at the respective first regions that is greater than a width in the second direction at a respective second region that is adjacent the first region.

In example embodiments, when the offset bias is provided for specific region a of respective ones of at least some of the initial mask layouts to design the plurality of final mask layouts, a negative offset bias in the second direction may be provided for first regions of at least some of the initial mask layouts to design the plurality of final mask layouts, each having a width in the second direction at the respective first regions that is less than a width in the second direction at a respective second region that is adjacent the first region.

In example embodiments, the masks and the spacers may be removed after forming the dummy gate mask between the spacers.

In example embodiments, when the dummy gate layer structure is formed on the active fin and the isolation layer pattern, a dummy gate insulation layer and a dummy gate electrode layer sequentially stacked on the active fin and the isolation layer pattern may be formed.

In example embodiments, each dummy gate structure includes a dummy gate insulation layer pattern, a dummy gate electrode and a dummy gate mask that are sequentially stacked on the active fine and the isolation pattern.

In example embodiments, dummy gate spacers may be formed on opposed sidewalls of each dummy gate structure, after forming the dummy gate structures.

In example embodiments, after forming the dummy gate spacers, upper portions of the active fin not covered by the dummy gate structures and the dummy gate spacers may be removed to form trenches. An epitaxial growth process may be performed to form a source/drain layer filling each trench.

In example embodiments, before replacing the dummy gate structures with the gate structures, an insulating interlayer may be formed on the active fin and the isolation layer pattern to cover the dummy gate structures and the dummy gate spacers. The insulating interlayer, the dummy gate mask and the dummy gate spacers may be planarized until the dummy gate electrode is exposed.

In example embodiments, when the dummy gate structures are replaced with the gate structures, the exposed dummy gate electrode and the dummy gate insulation layer pattern thereunder may be removed to form an opening exposing a top surface of the active fin. A gate insulation layer pattern may be formed on the exposed top surface of the active fin and a sidewall of the opening. A gate electrode may be formed on the gate insulation layer.

In example embodiments, before forming the gate insulation layer pattern on the exposed top surface of the active fin and the sidewall of the opening, an interface layer pattern may be formed to include an oxide on the exposed top surface of the active fin. The gate insulation layer pattern may be formed to include a high-k dielectric material on the interface layer pattern and the sidewall of the opening.

In example embodiments, before forming the gate electrode on the gate insulation layer pattern, a work function control layer pattern may be formed on the gate insulation layer pattern. The gate electrode may be formed on the work function control layer pattern.

According to example embodiments, there is provided a method of manufacturing a semiconductor device. In the method, an isolation layer pattern is formed on a substrate to define an active fin protruding from the isolation layer pattern. A gate layer structure and a mask layer are sequentially formed on the active fin and the isolation layer pattern. The mask layer is patterned to form a plurality of masks each extending in a first direction. Spacers are formed on opposed sidewalls of each mask. A gate mask is formed between the spacers. The gate layer structure is patterned using the gate mask as an etching mask to form a plurality of gate structures, each of which extends in the first direction. When the mask layer is patterned to form the plurality of masks, a plurality of initial mask layouts are designed, each of which extends in the first direction. An offset bias in a second direction substantially perpendicular to the first direction is provided for first regions of at least some of the initial mask layouts using a marker to design a plurality of final mask layouts, each of which has a width in the second direction at the respective first regions that is different from a width in the second direction at respective second regions that are adjacent the corresponding first regions along the first direction. The mask layer is patterned according to the final mask layout.

In example embodiments, each spacer has a width in the second direction that is constant along the first direction. A portion of the gate mask that is adjacent the first region of each mask may have a width in the second direction that is different from a width in the second direction of a portion of the gate mask that is adjacent the second region of each mask.

In example embodiments, when the offset bias is provided for the respective first regions of the initial mask layouts to design the final mask layouts, a positive offset bias in the second direction may be provided for the first regions of the initial mask layouts to design the final mask layouts, each of which has a width in the second direction at its first region that is greater than a width in the second direction at its second region. Alternatively, a negative offset bias in the second direction may be provided for the first regions of the initial mask layouts to design the final mask layouts that each has a width in the second direction at their respective first regions that is less than a width in the second direction at their respective second regions.

In the method of manufacturing the semiconductor device in accordance with example embodiments, the offset bias may be applied to the specific region of the initial mask layout using the marker, and thus the final mask layouts having different widths according to regions may be designed. The mask layer may be patterned using the mask having the final mask layouts so that the real mask having different widths according to regions may be easily formed with no additional etching mask.

Additionally, the dummy gate mask may be formed between the spacers on the sidewalls of the mask and the dummy gate layer structure may be patterned using the dummy gate mask as an etching mask to form the dummy gate structure having different widths according to regions. The dummy gate structure may be replaced with the gate structure, so that the gate structure having different widths according to regions may be easily formed, and the resistance of the transistor including the gate structure may be easily controlled.

According to further example embodiments, methods of manufacturing a semiconductor device are provided in which a plurality of initial mask layouts are designed, each initial mask layout extending in a first direction and having a substantially constant width in a second direction that is substantially perpendicular to the first direction. An offset bias in the second direction is assigned for at least one region of at least some of the initial mask layouts to provide a plurality of final mask layouts, the final mask layouts each extending in the first direction and at least some of the final mask layouts having a width in the second direction that varies along the first direction. A first layer structure is formed on a substrate. A mask layer is formed on the first layer structure. The mask layer is patterned using the final mask layouts to form a plurality of first masks that extend in the first direction, where at least some of the first masks have a width in the second direction that varies along the first direction. Spacers are formed on opposed sidewalls of each of the plurality of first masks. A plurality of second masks are formed, each second mask being formed in between a respective pair of adjacent ones of the first masks. The first layer structure is patterned using the second masks as an etching mask to form a plurality of structures that extend in the first direction and that have a width in the second direction that varies along the first direction.

In example embodiments, the first layer structure is a dummy gate layer structure, and the dummy gate layer structure is formed on a plurality of active fins that extend upwardly from the substrate and a plurality of isolation patterns that are between adjacent ones of the active fins, the active fins extending in the second direction and protruding above the isolation patterns.

In example embodiments, the first layer structure is a gate layer structure, and the gate layer structure is formed on a plurality of active fins that extend upwardly from the substrate and a plurality of isolation patterns that are between adjacent ones of the active fins, the active fins extending in the second direction and protruding above the isolation patterns.

In example embodiments, the offset bias comprises a first offset bias and the at least one region comprises a first region, and for a first of the initial mask layouts, a non-zero second offset bias that is different than the first offset bias is assigned in the second direction for a second region so that the final mask layout includes a first mask layout that has a first region having the offset bias, a second region having the second offset bias and a third region that has no offset bias.

In example embodiments, each spacer has a width in the second direction that is constant along the first direction.

BRIEF DESCRIPTION OF THE DRAWINGS

Example embodiments will be more clearly understood from the following detailed description taken in conjunction with the accompanying drawings. FIGS. 1 to 34 represent non-limiting, example embodiments as described herein.

FIG. 1 is a flowchart illustrating stages of a method of forming patterns in accordance with example embodiments;

FIG. 2 is a block diagram illustrating a layout design system that may be in the method of forming patterns illustrated in the flowchart of FIG. 1;

FIG. 3 illustrates an initial layout of a mask designed by the layout design system of FIG. 2;

FIGS. 4 and 5 illustrates a final layout of the mask designed by the layout design system of FIG. 2; and FIGS. 6 to 34 are plan views and cross-sectional views illustrating stages of a method of manufacturing a semiconductor device in accordance with example embodiments.

DESCRIPTION OF EMBODIMENTS

Figure 1:
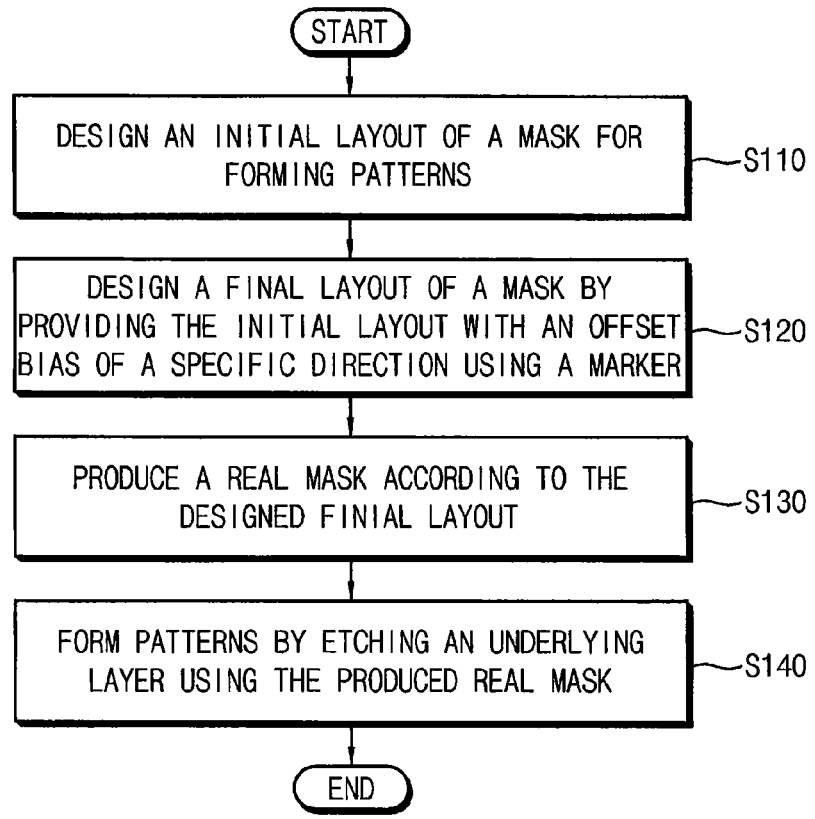

The inventive concepts will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, it will be appreciated that the regions illustrated in the figures are schematic in nature.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
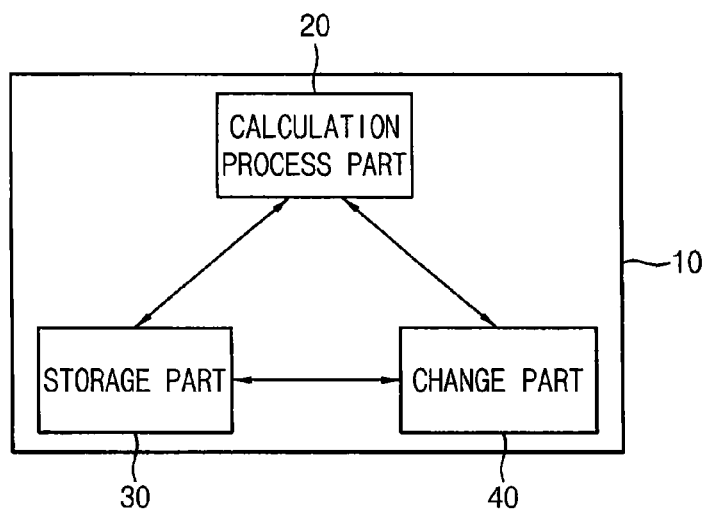
Figure 3:
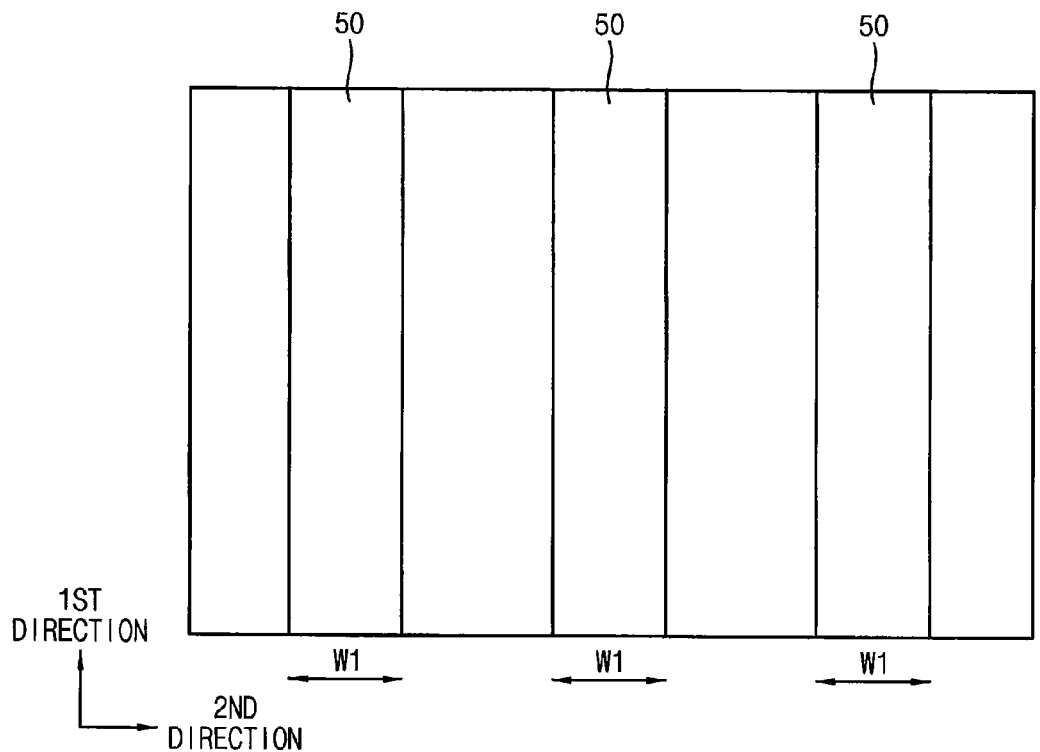
Figure 4:
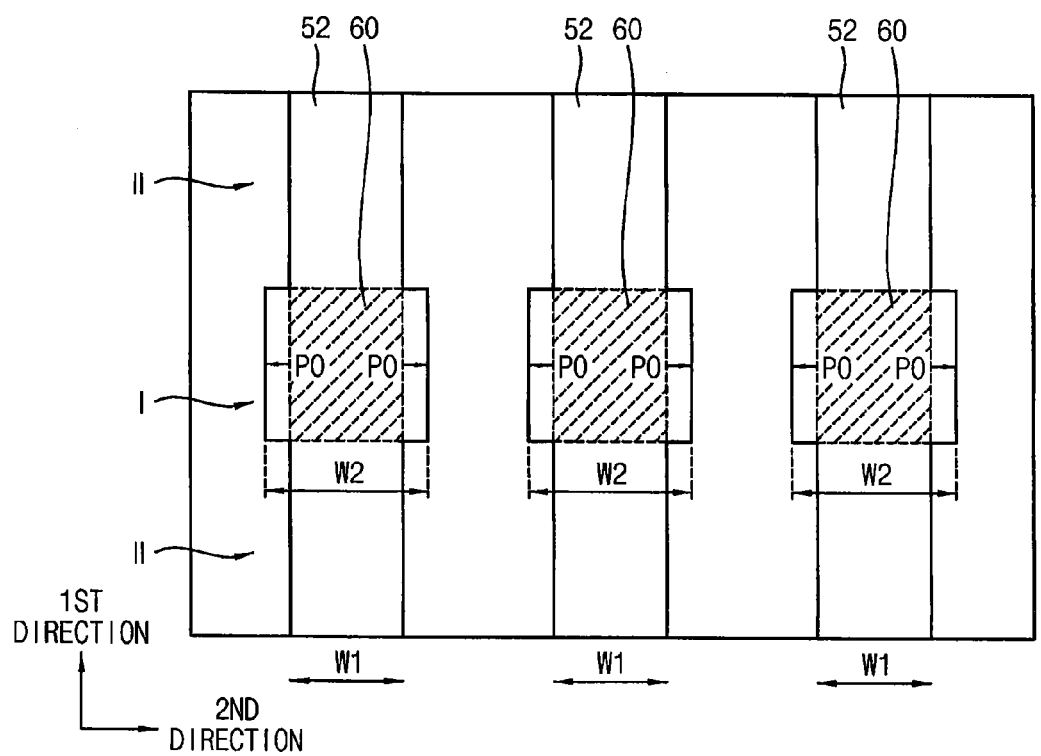
Figure 5:
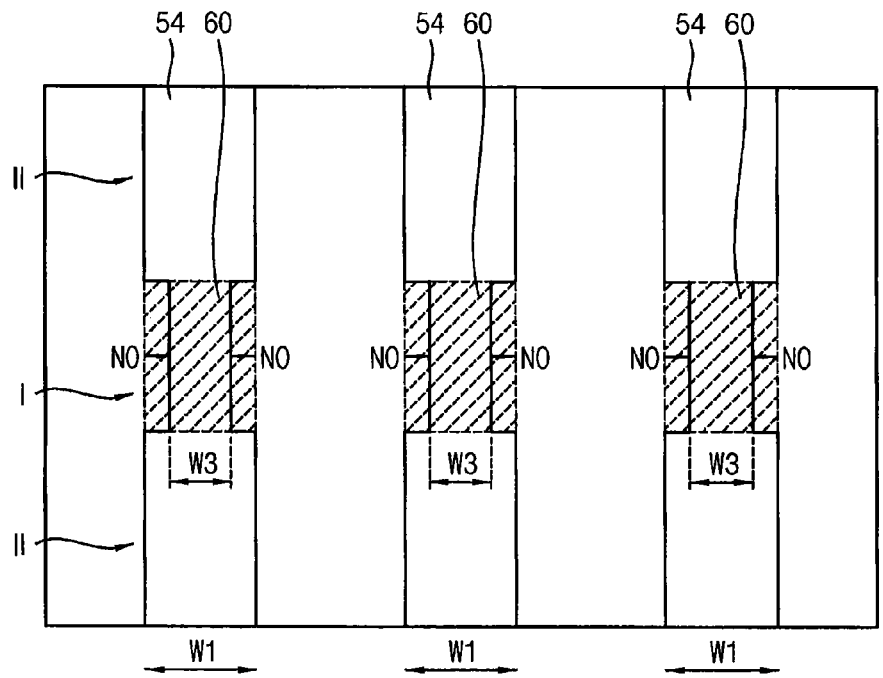

FIG. 1 is a flowchart illustrating stages of a method of forming patterns in accordance with example embodiments. FIG. 2 is a block diagram illustrating a layout design system that may be used for implementing the method of forming patterns of FIG. 1. FIG. 3 illustrates an initial mask layout designed by the layout design system of FIG. 2. FIGS. 4 and 5 illustrate a final mask layout designed by the layout design system of FIG. 2.

Referring to FIGS. 1 to 3, in step S110, an initial mask layout 50 for forming patterns may be designed by a layout design system 10.

In example embodiments, the layout design system 10 may include a calculation process part 20, a storage part 30, and a change part 40.

The calculation process part 20 may design an initial mask layout or a final mask layout by calculation processes. For example, the calculation process part 20 may include a processor.

The storage part 30 may store the initial and final mask layouts that are designed by the calculation process part 20, and may also store various codes. For example, the storage part 30 may include flash memory devices, or variable resistance memory devices, e.g., phase-change random access memory (PRAM) devices, magnetic random access memory (MRAM) devices, resistive random access memory (ReRAM) devices, or the like. Alternatively, the storage part 30 may include bulk storage devices, e.g., hard disk drives, solid state drives (SSDs), or the like. In example embodiments, the initial and final mask layouts may be stored in the storage part 30 as a library.

When an initial mask layout 50 that is stored in the storage part 30 needs to be changed, the change part 40 may change the initial mask layout 50 by performing a specific process.

In example embodiments, the change part 40 may generate a marker at a specific region of the initial mask layout 50, and the calculation process part 20 may change the initial mask layout 50 at the specific region in accordance with a predetermined rule to design a final mask layout. The final mask layout may be stored in the storage part 30.

In example embodiments, the change part 40 may be implemented as hardware or software. When the change part 40 is implemented as software, it may be stored, e.g., as codes in the storage part 30.

The elements of the layout design system 10, e.g., the calculation process part 20, the storage part 30 and the change part 40 may be implemented as hardware and/or software. The layout design system 10 may further include one or more elements in addition to the above-described elements, which additional element(s) may also be implemented as hardware and/or software.

Referring to FIGS. 1 to 3 again, the initial mask layout 50 for forming patterns may be designed by the calculation process part 20 of the layout design system 10, and may be stored in the storage part 30.

In example embodiments, the initial mask layout 50 may comprise a plurality of initial mask layouts 50, each of which may extend in a first direction. The initial mask layouts 50 may be spaced apart from each other along a second direction that is substantially perpendicular to the first direction. Each of the initial mask layouts 50 may have a first width W1 in the second direction, and the first width W1 may have a constant value in the first direction.

Referring to FIGS. 1, 2 and 4, in step S120, an offset bias in a specific direction may be provided for a specific region of an initial mask layout 50 using a marker 60 so that a final mask layout 52 may be designed.

In example embodiments, when the initial mask layout 50 needs to be changed, the change part 40 of the layout design system 10 may generate the marker 60 at a specific region, e.g., at a first region I. A positive offset bias PO in the second direction may be provided in the first region I at which the marker 60 is generated, and the calculation process part 20 may change the initial mask layout 50 so that a width of the mask layout in the second direction at the first region I may be greater than a width of the mask layout in the second direction at a second region II that is adjacent to the first region I along the first direction.

The modified initial mask layout may be stored as a final mask layout 52 in the storage part 30. In example embodiments, each final mask layout 52 may have a width in the second direction that may vary along the first direction. Each final mask layout 52 may have a second width W2 at the first region I at which the marker 60 is generated, which may be greater than the first width W1 at the second region II at which no marker is generated. Thus, each final mask layout 52 may have a width in the second direction that may vary along the first direction.

In the embodiment depicted in FIG. 4 only one first region I is formed in each final mask layout 52, however, the inventive concepts are not limited thereto, and in some embodiments, each final mask layout 52 may include two or more first regions I along the first direction. The second widths W2 of the final mask layouts 52 at the respective first regions I may be substantially the same as or different from each other. When the positive offset bias PO is provided for the plurality of first regions I at which the markers 60 are generated, specific values of the offset bias provided for the first regions I may be set to be different from each other, and thus the second widths W2 at the first regions I may be different from each other in some embodiments.

Referring to FIG. 5, in other embodiments, a negative offset bias NO may be provided for the first region I at which the marker 60 is generated, which may be different from that of FIG. 4. In the embodiment of FIG. 5, the calculation process part 20 may change the initial mask layout 50 to generate a final mask layout 54 that has a width in the second direction at the first region I that is less than a width in the second direction of the final mask layout 54 at a second region II that is adjacent to the first region I along the first direction.

Each final mask layout 54 stored in the storage part 30 may have a third width W3 at the first region I at which the marker 60 is generated which may be less than the first width W1 at the second region II at which no marker is generated. Thus, each final mask layout 54 may have a width in the second direction that may vary along the first direction.

Similar to the embodiments that are described above with reference to FIG. 4, in some embodiments that have the configuration of FIG. 5, a plurality of first regions I may be formed along the first direction in each final mask layout 54, and the third widths W3 of each final mask layout 54 at the respective first regions I may be substantially the same as or different from each other.

Referring to FIG. 1, in step S130, a real mask may be formed according to the final mask layout 52 and/or 54 designed in step S120.

In example embodiments, a mask layer may be formed on an etching object layer from which patterns may be formed, and may be patterned by a photolithography process using the designed final layout to form the real mask.

In step S140, the etching object layer may be etched using the real mask as an etching mask to form patterns having desired shapes.

For example, a plurality of fine patterns may be formed by a double patterning process, and the mask may have a width that varies along the first direction, so that each of the fine patterns may also have a width that varies along the first direction.

By the above processes, fine patterns having varying widths may be easily formed.

FIGS. 6 to 34 are plan views and cross-sectional views illustrating stages of a method of manufacturing a semiconductor device in accordance with example embodiments. Particularly, FIGS. 6, 8, 10, 12, 14, 16, 18, 21, 24, 27 and 31 are plan views, and FIGS. 7, 9, 11, 13, 15, 17, 19-20, 22-23, 25-26, 28-30 and 32-34 are cross-sectional views.

Figure 30:
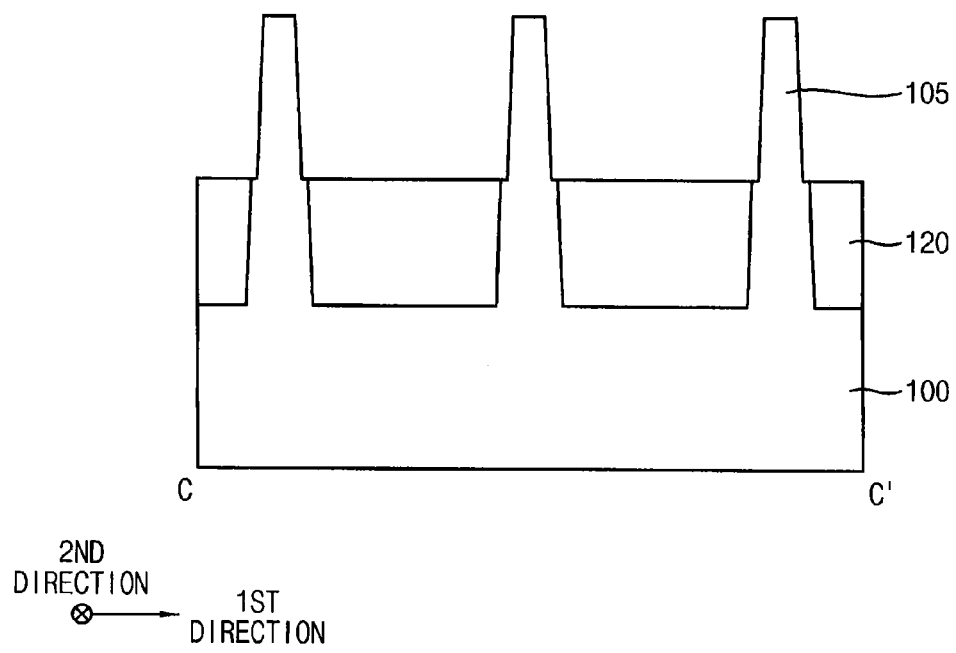
Figure 31:
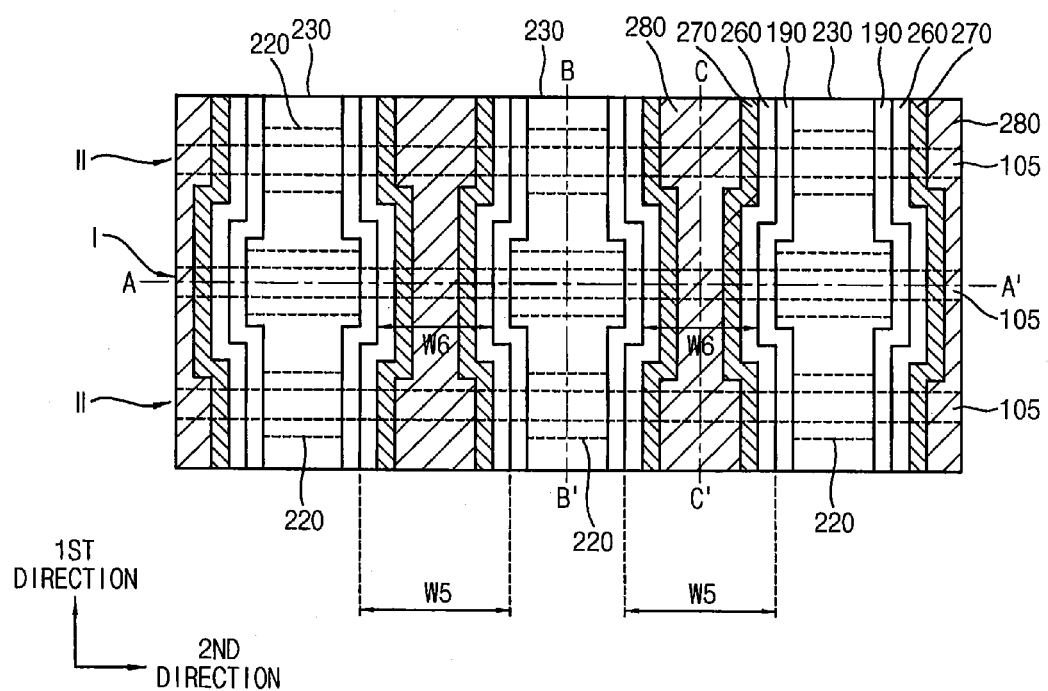
Figure 32:
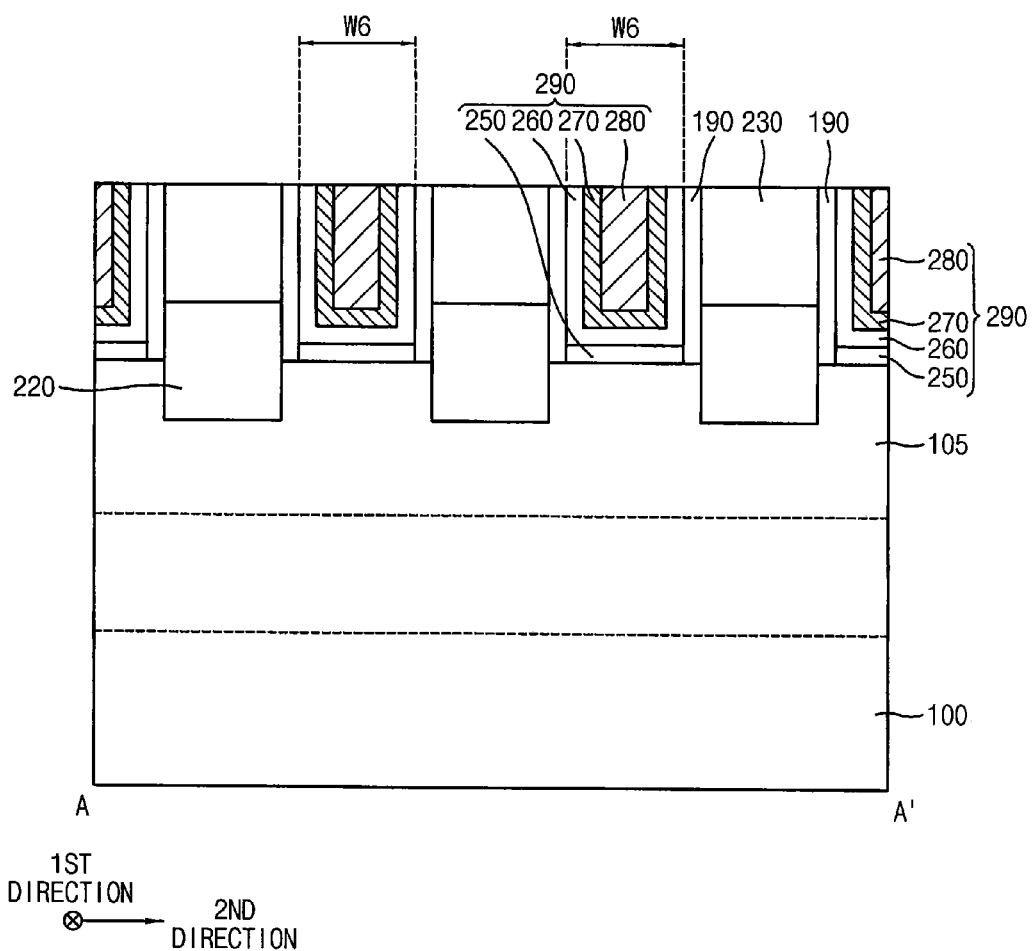
Figure 33:
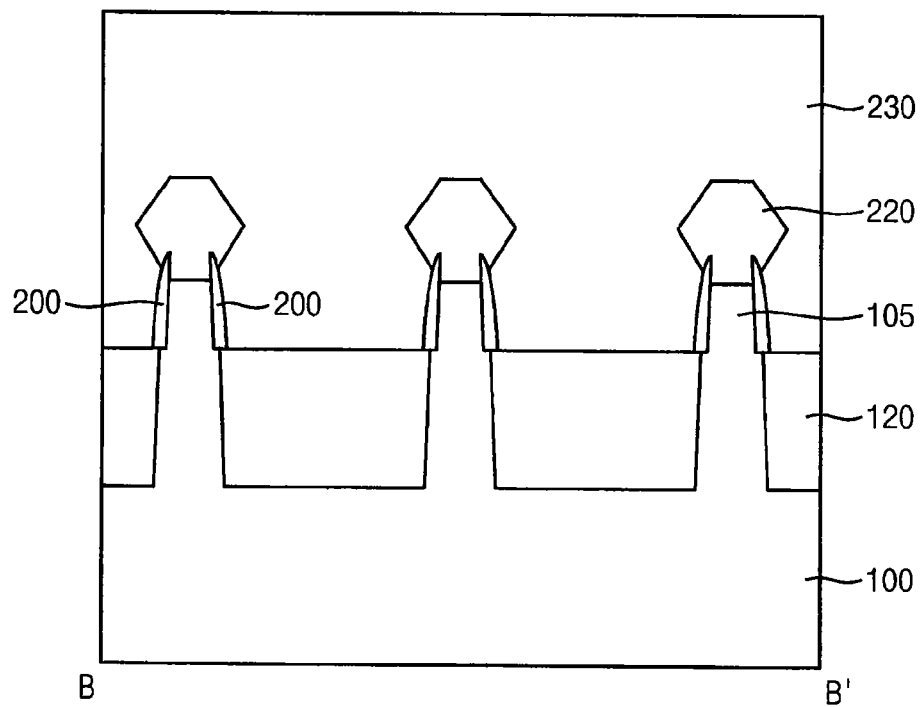
Figure 34:
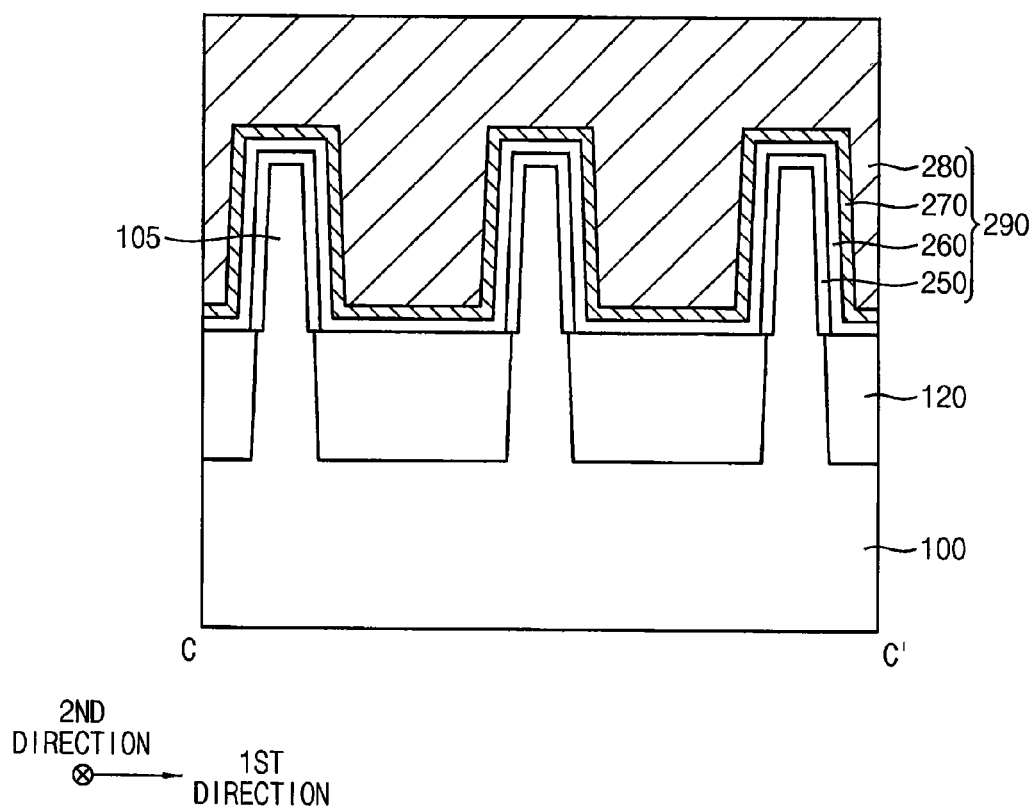

FIGS. 11, 13, 15, 17, 19, 22, 25, 28 and 32 are cross-sectional views taken along a line A-A' of corresponding plan views, FIGS. 7, 9, 20, 23, 26, 29 and 33 are cross-sectional views taken along a line B-B' of corresponding plan views, and FIGS. 30 and 34 are cross-sectional views taken along a line C-C' of corresponding plan views.

Figure 6:
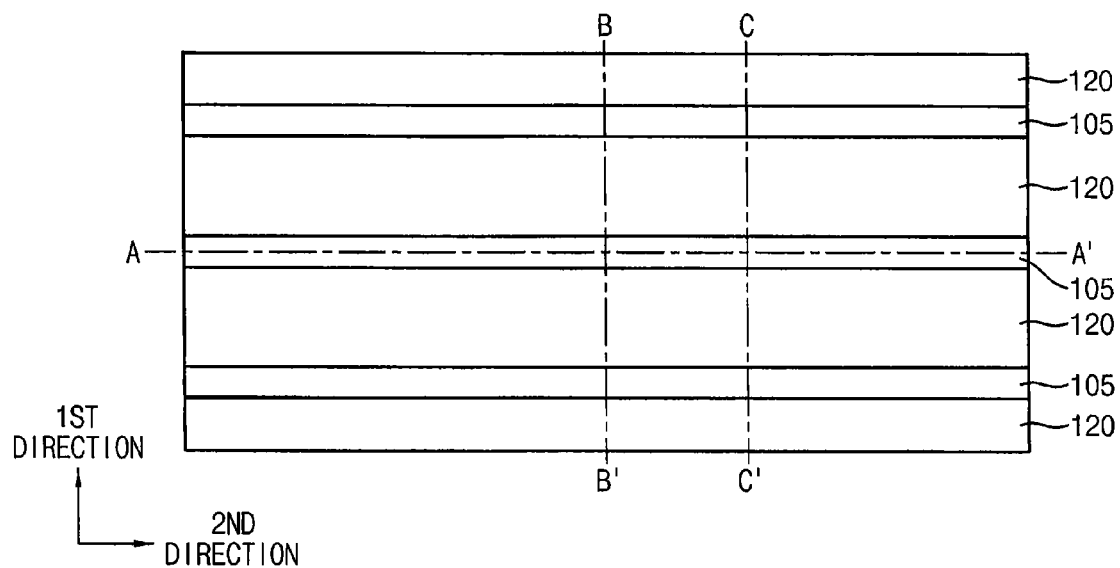
Figure 7:
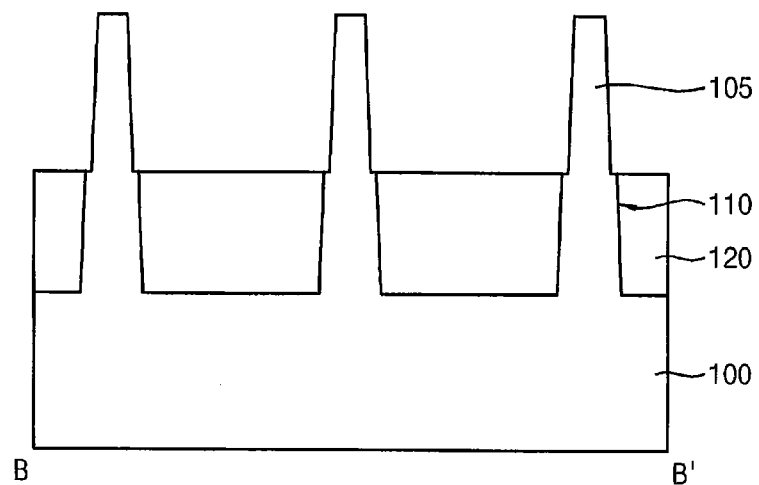

Referring to FIGS. 6 and 7, an upper portion of a substrate 100 may be partially removed to form a first trench 110, and an isolation layer pattern 120 may be formed on the substrate 100 to fill the first trench 110.

The substrate 100 may include a semiconductor material, e.g., silicon, germanium, or the like, or III-V compound semiconductor materials, e.g., GaP, GaAs, GaSb, or the like. In some embodiments, the substrate 100 may be a silicon-on-insulator (SOI) substrate or a germanium-on-insulator (GOI) substrate.

In example embodiments, the isolation layer pattern 120 may be formed by forming an isolation layer on the substrate 100 to sufficiently fill the first trench 110, planarizing the isolation layer until a top surface of the substrate 100 may be exposed, and removing an upper portion of the planarized isolation layer to expose an upper portion of the first trench 110. When the upper portion of the planarized isolation layer is removed, an upper portion of the substrate 100 adjacent thereto may be also partially removed. The isolation layer may include an oxide, e.g., silicon oxide.

As the isolation layer pattern 120 is formed, a field region of which a top surface may be covered by the isolation layer pattern 120 and an active region of which a top surface may not be covered by the isolation layer pattern 120 may be defined in the substrate 100. The active region may protrude from the isolation layer pattern 120 and have a fin-like shape so as to be referred to as an active fin 105. In an example embodiment, as shown in FIG. 7, sidewalls of a lower portion of the active fin 105 may be covered by the isolation layer pattern 120 and may have a width in a first direction that is substantially parallel to the top surface of the substrate 100 that is greater than that of an upper portion of the active fin 105 that is not covered by the isolation layer pattern 120.

As shown in FIG. 6, in example embodiments, the active fin 105 may extend in a second direction that may be substantially parallel to the top surface of the substrate 100 and substantially perpendicular to the first direction. A plurality of active fins 105 may be formed in the first direction.

Figure 8:
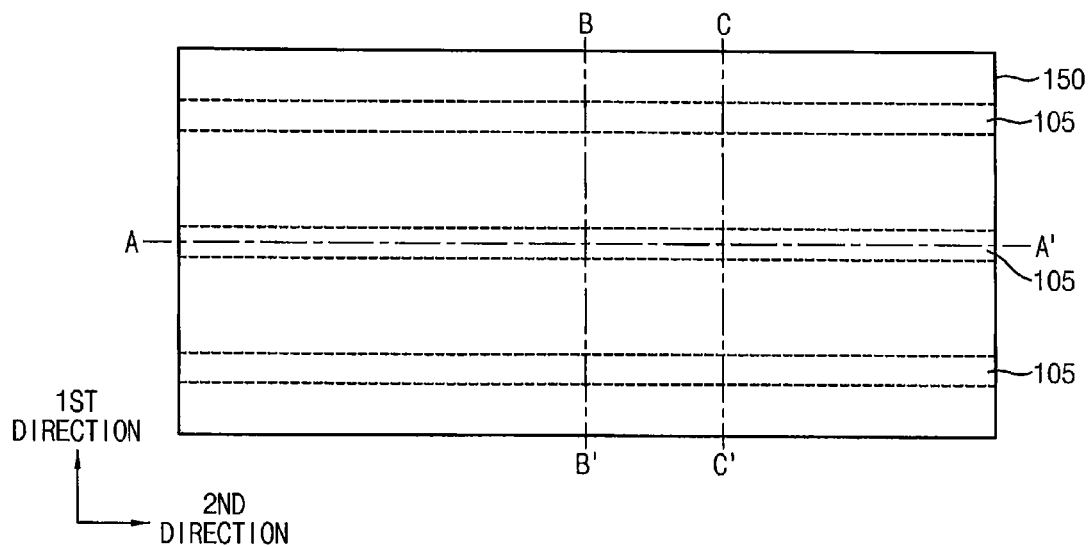

Referring to FIGS. 8 and 9, a dummy gate layer structure and a mask layer 150 may be sequentially formed on the active fin 105 and the isolation layer pattern 120.

In example embodiments, the dummy gate layer structure may include a dummy gate insulation layer 130 and a dummy gate electrode layer 140 that are sequentially stacked on the active fins 105 and the isolation patterns 120.

The dummy gate insulation layer 130 may include an oxide, e.g., silicon oxide, the dummy gate electrode layer 140 may include, e.g., polysilicon, and the mask layer 150 may include a nitride, e.g., silicon nitride. The dummy gate insulation layer 130, the dummy gate electrode layer 140 and the mask layer 150 may be formed by a chemical vapor deposition (CVD) process, a physical vapor deposition (PVD) process, an atomic layer deposition (ALD) process, or the like. Alternatively, the dummy gate insulation layer 130 may be formed by a thermal oxidation process.

Figure 10:
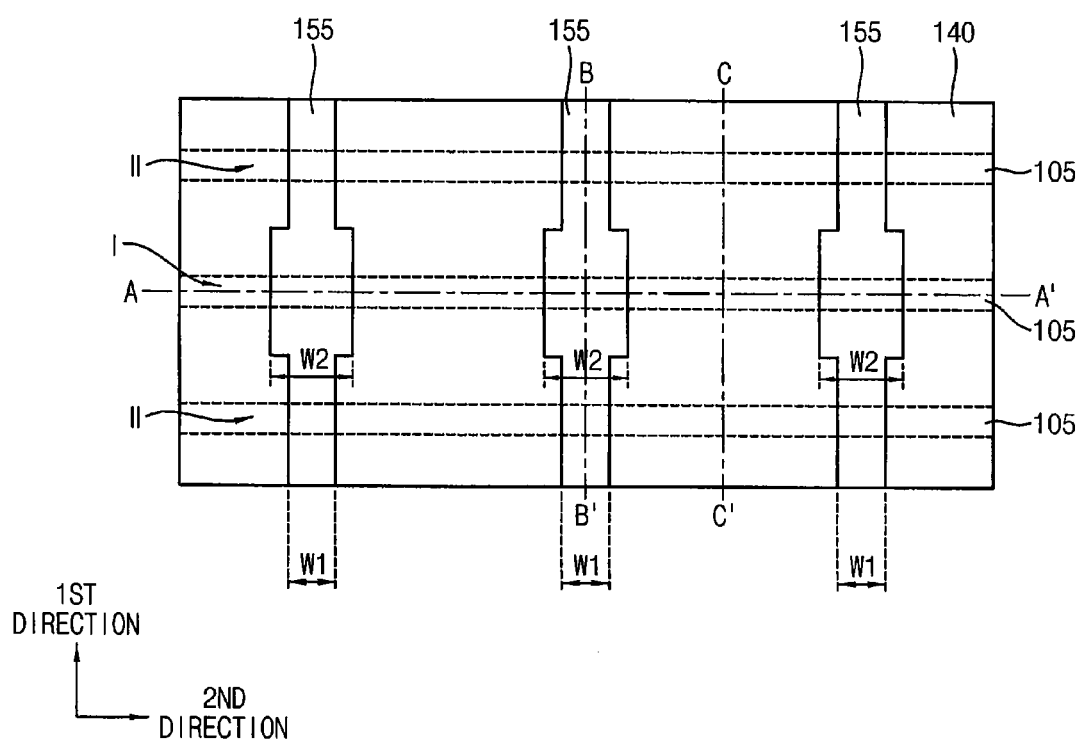
Figure 11:
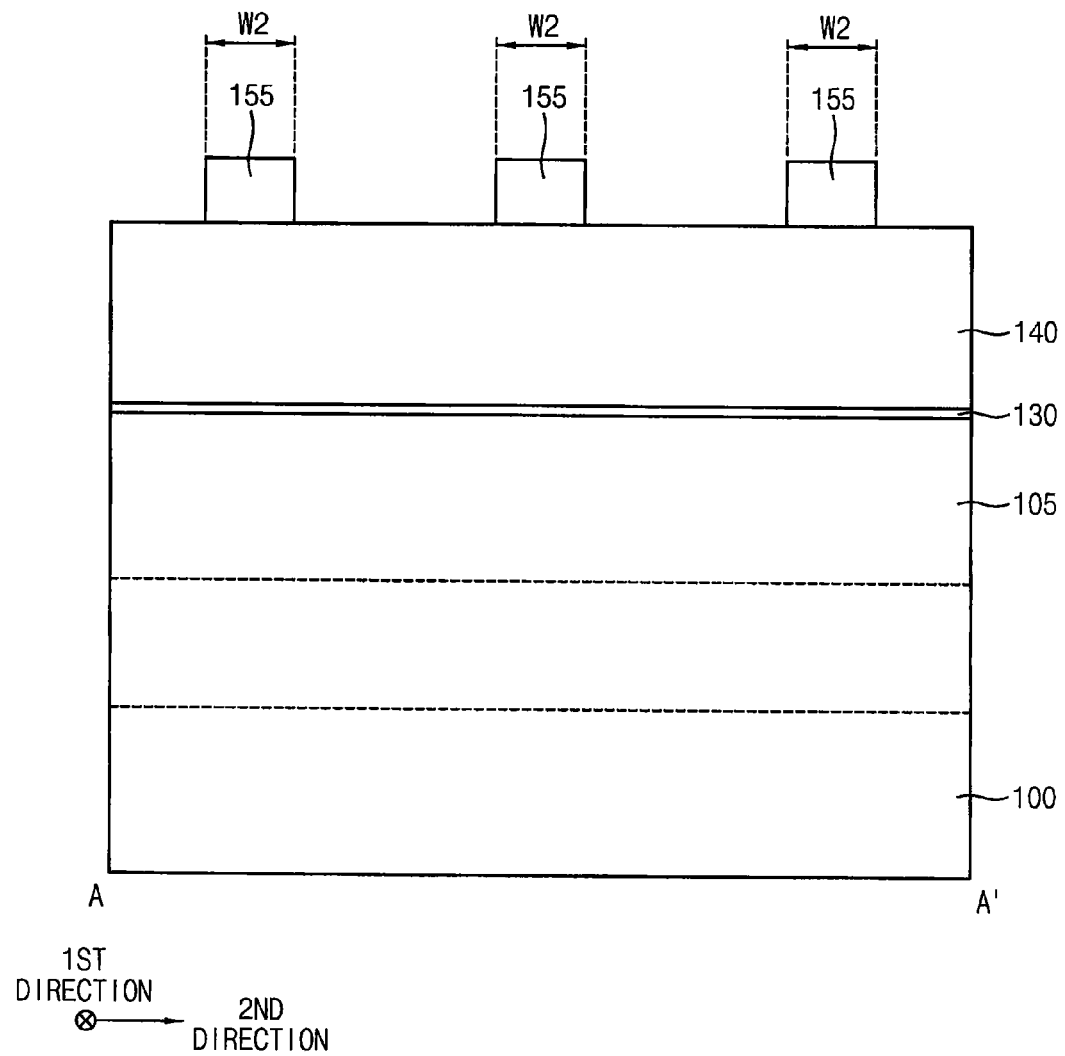

Referring to FIGS. 10 and 11, the mask layer 150 may be patterned to form masks 155. In example embodiments, the masks 155 may be formed by processes substantially the same as or similar to those of steps S110, S120 and S130 illustrated with reference to FIGS. 1 to 4.

That is, initial mask layouts 50 may be designed by a calculation process part 20 of a layout design system 10, and may be stored in a storage part 30. Each initial mask layout 50 may extend in a first direction, and the initial mask layouts 50 are spaced apart from each other along a second direction that is substantially perpendicular to the first direction. Each of the initial mask layouts 50 may have a first width W1 in the second direction.

A change part 40 of the layout design system 10 may generate a marker 60 at a first region I of the initial mask layout 50, and a positive offset bias PO in the second direction may be provided for the first region I at which the marker 60 is generated. Thus, the calculation process part 20 may change the initial mask layout 50 so that a width in the second direction at the first region I may be greater than a width in the second direction at a second region II that is adjacent to the first region I along the first direction by a given value.

The changed initial mask layout 50 may be stored as a final mask layout 52 in the storage part 30. A second width W2 of each final mask layout 52 at the first region I may be greater than a first width W1 of each final mask layout 52 at the second region II, and the real mask 155 may be formed by using the final mask layout 52.

In example embodiments, after a photoresist layer (not shown) is formed on the mask layer 150, an exposure process and a development process may be performed on the photoresist layer according to the stored final mask layout 52 to form a photoresist pattern (not shown), and the mask layer 150 may be patterned using the photoresist pattern as an etching mask to form the mask 155.

Thus, first and second regions I and II of the real mask 155 may be defined according to the first and second regions I and II of the final mask layout 52 that is designed by the layout design system 10. Additionally, the real mask 155 may extend in the first direction, and a plurality of real masks 155 may be formed that are spaced apart from each other along a second direction that is substantially perpendicular to the first direction. A second width W2 of each mask 155 at the first region I may be greater than a first width W1 of each mask 155 at the second region II.

In the specific embodiment depicted in FIGS. 10 and 11, only one first region I is formed in each mask 155. It will be appreciated, however, the inventive concepts are not limited thereto, and that in other embodiments a plurality of first regions I may be formed along the first direction in each mask 155. Widths in the second direction of the first regions I, i.e., second widths W2, may be substantially the same as or different from each other. Thus, each mask 155 may have a width in the second direction that may vary along the first direction.

When the process for forming patterns illustrated with reference to FIG. 5 is used, each mask 155 may have the second width W2 at the first region I that is less than the first width W1 at the second region II.

Figure 12:
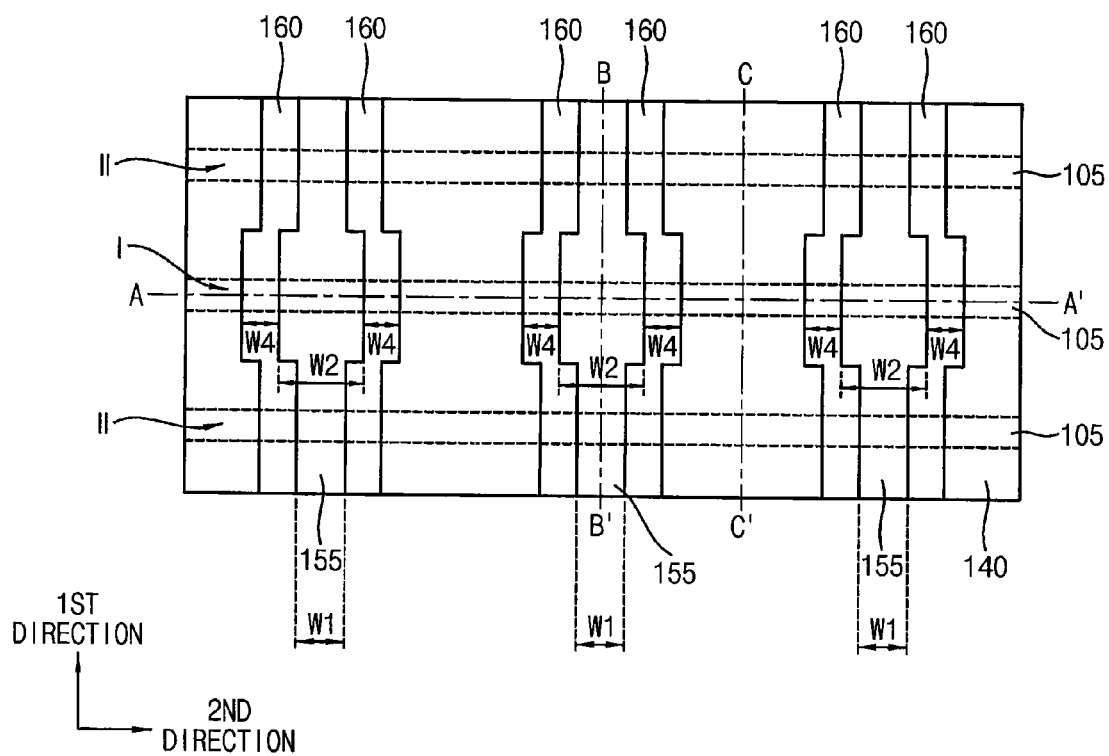
Figure 13:
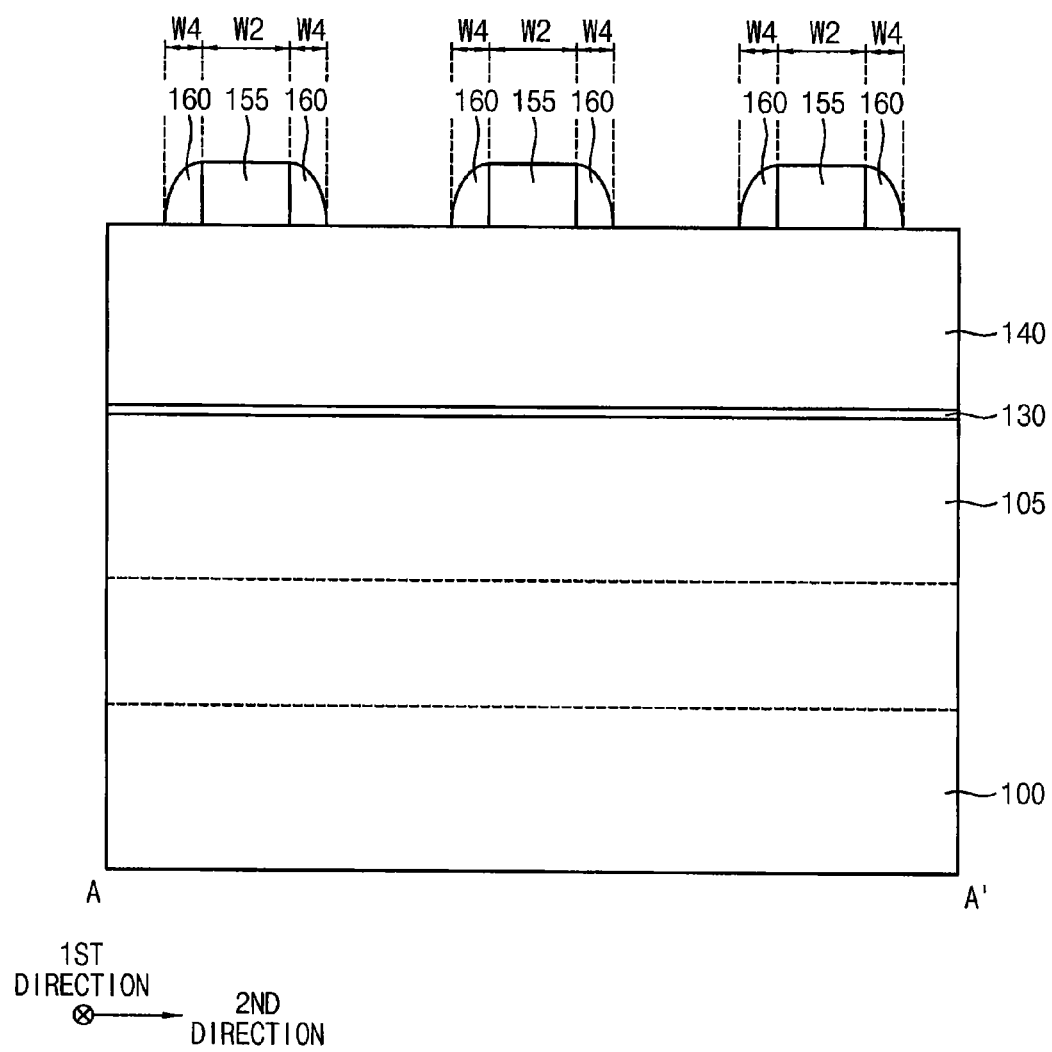

Referring to FIGS. 12 and 13, spacers 160 may be formed on sidewalls of each mask 155.

In example embodiments, the spacers 160 may be formed by forming a first spacer layer on the dummy gate electrode layer 140 to cover the masks 155, and anisotropically etching the first spacer layer. The first spacer layer may include a nitride, e.g., silicon nitride, or an oxide, e.g., silicon oxide.

In example embodiments, each spacer 160 may have a fourth width W4 in the second direction that may have a constant value along the first direction.

Figure 14:
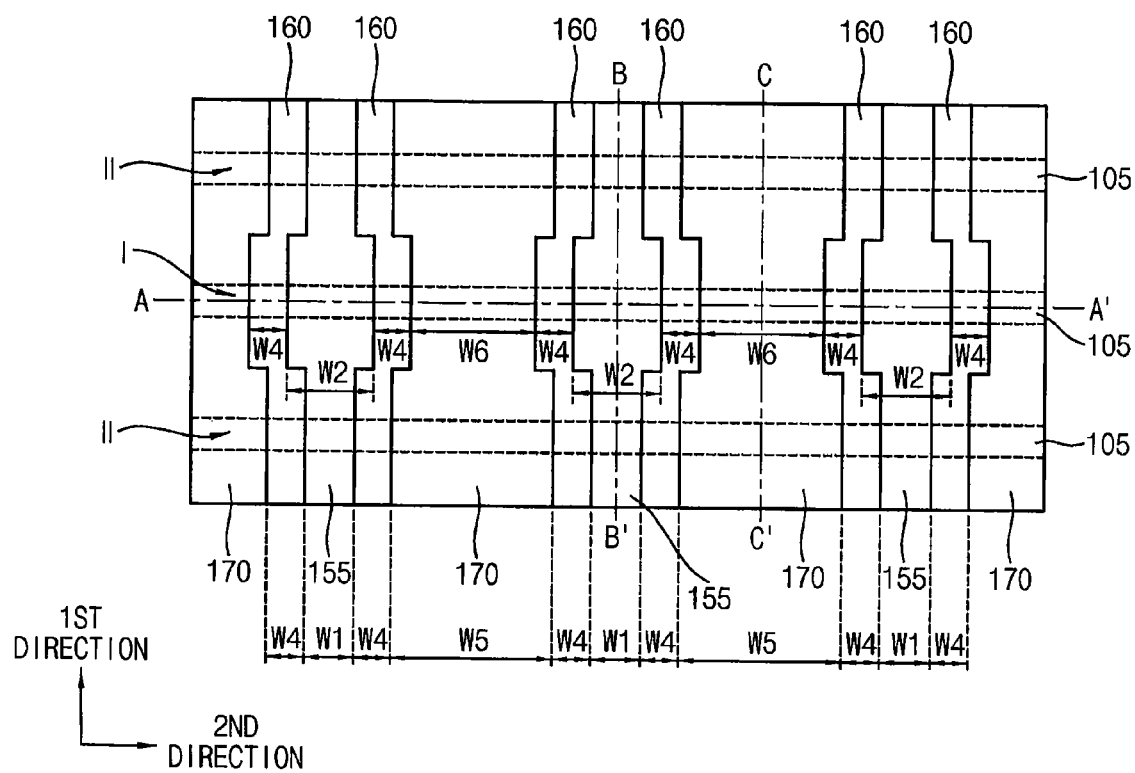
Figure 15:
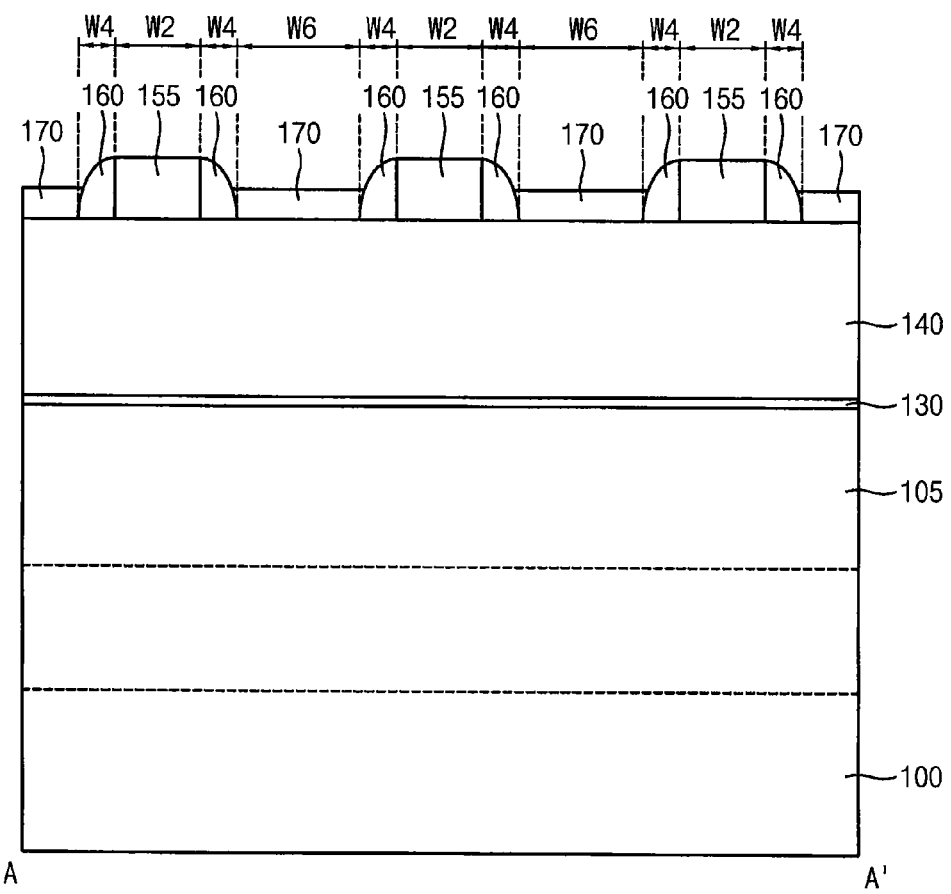

Referring to FIGS. 14 and 15, dummy gate masks 170 may be formed between adjacent pairs of spacers 160.

In example embodiments, the dummy gate masks 170 may be formed by forming a dummy gate mask layer on the dummy gate electrode layer 140 to cover the masks 155 and the spacers 160, and removing an upper portion of the dummy gate mask layer. In an example embodiment, the dummy gate mask layer may be planarized by a chemical mechanical polishing (CMP) process until top surfaces of the masks 155 are exposed, and an upper portion of the planarized dummy gate mask layer may be removed by an etch back process to form the dummy gate masks 170.

The dummy gate mask layer may include, e.g., silicon nitride, silicon oxide, or the like. In an example embodiment, the dummy gate mask layer may include a material having an etching selectivity with respect to the first spacer layer. Thus, when the first spacer layer includes silicon nitride or silicon oxide, the dummy gate mask layer may include silicon oxide or silicon nitride, respectively.

In example embodiments, each dummy gate mask 170 may have a sixth width W6 in the second direction at the first region I and a fifth width W5 in the second direction at the second region II. Each spacer 160 may have the fourth width W4 that may be constant at both of the first and second regions I and II, and each mask 155 may have the second width W2 at the first region I and the first width W1 less than the second width W2 at the second region II, and thus the sixth width W6 of the dummy gate mask 170 at the first region I may be less than the fifth width W5 thereof at the second region II. That is, the dummy gate mask 170 may have a width in the second direction that may vary along the first direction, which may correspond to the width of the mask 155 in the second direction which likewise varies along the first direction.

In example embodiments, a plurality of dummy gate masks 170 may be formed that are spaced apart from each other along the second direction.

Figure 16:
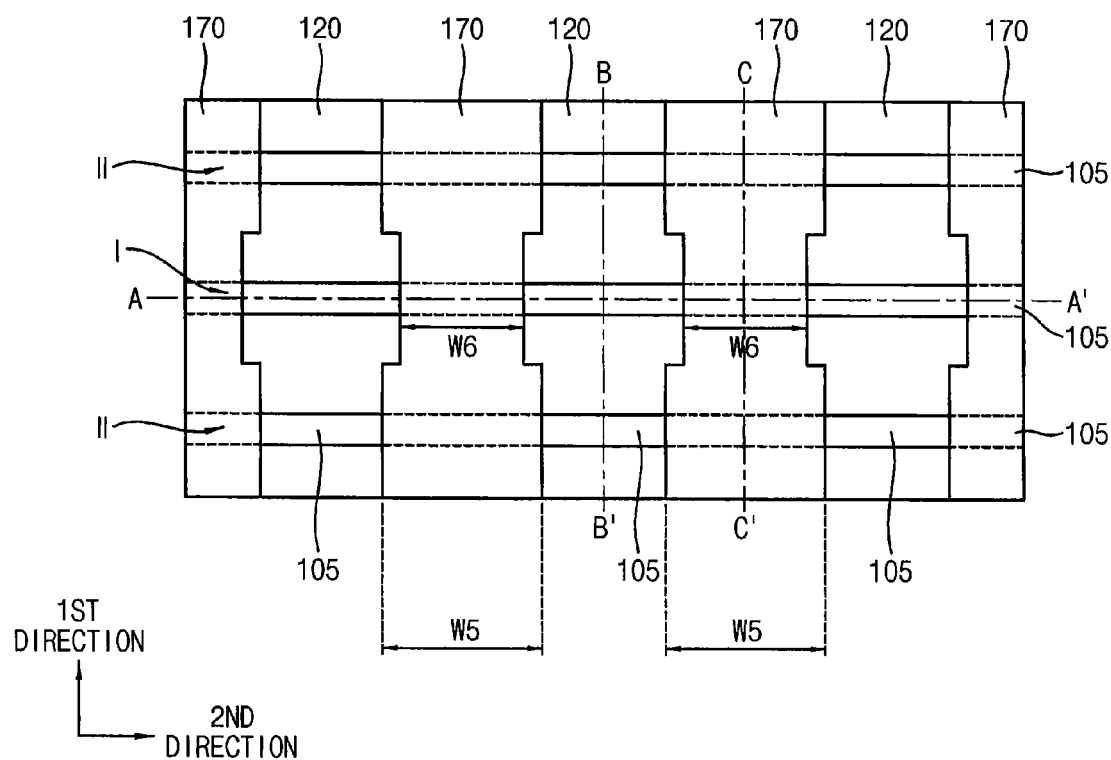
Figure 17:
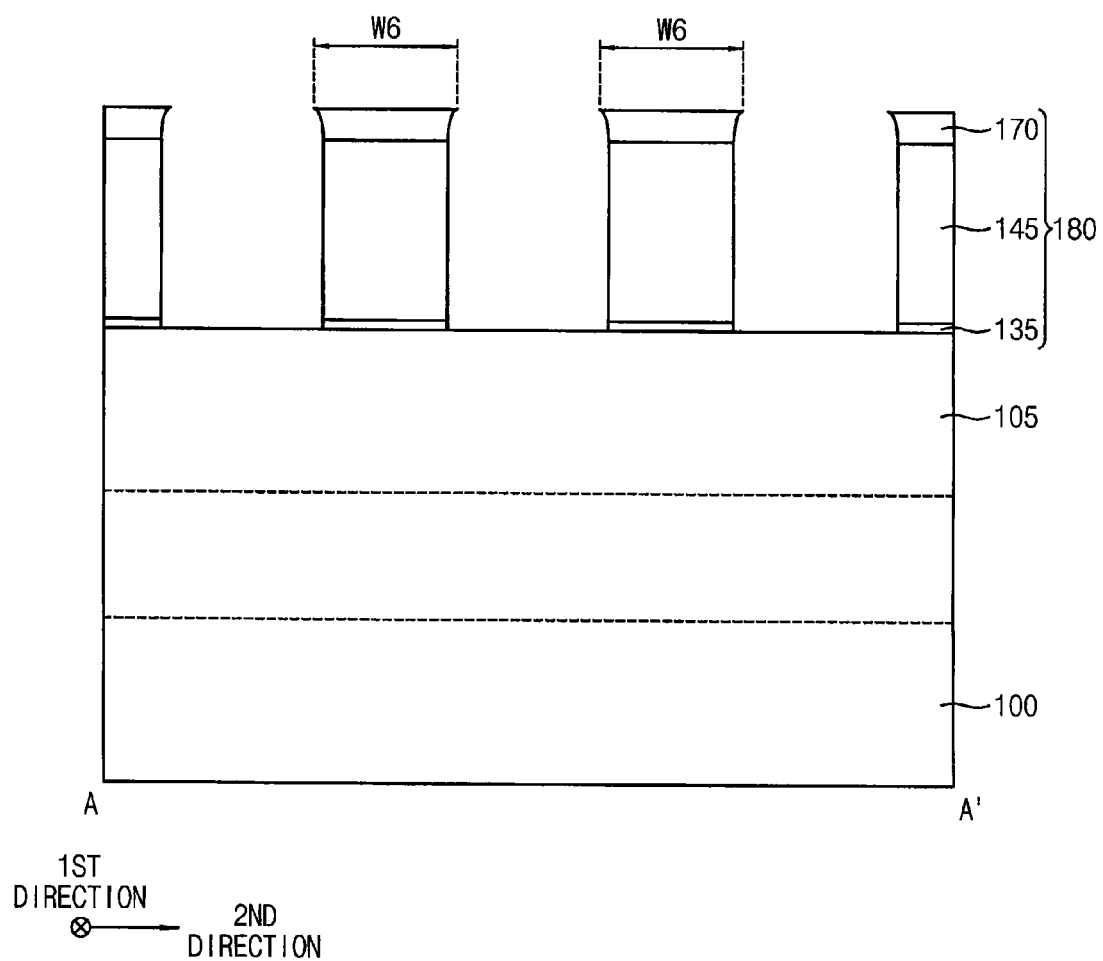

Referring to FIGS. 16 and 17, after removing the masks 155 and the spacers 160, the dummy gate electrode layer 140 and the dummy gate insulation layer 130 may be sequentially etched using the dummy gate masks 170 as etching masks to form dummy gate electrodes 145 and dummy gate insulation layer patterns 135, respectively.

Thus, a plurality of dummy gate structures 180 may be formed, each of which extends in the first direction and having a width in the second direction that may vary along the first direction. The dummy gate structures 180 may be formed on the active fin 105 and the isolation layer pattern 120. Each of the dummy gate structures 180 may include a dummy gate insulation layer pattern 135, a dummy gate electrode 145 and a dummy gate mask 170 that are sequentially stacked. Each of the dummy gate structures 180 may have the sixth width W6 at the first region I, and the fifth width W5 that is greater than the sixth width W6 at the second region II.

An ion implantation process may be performed to form an impurity region (not shown) at an upper portion of the active fin 105 adjacent the dummy gate structure 180.

Figure 18:
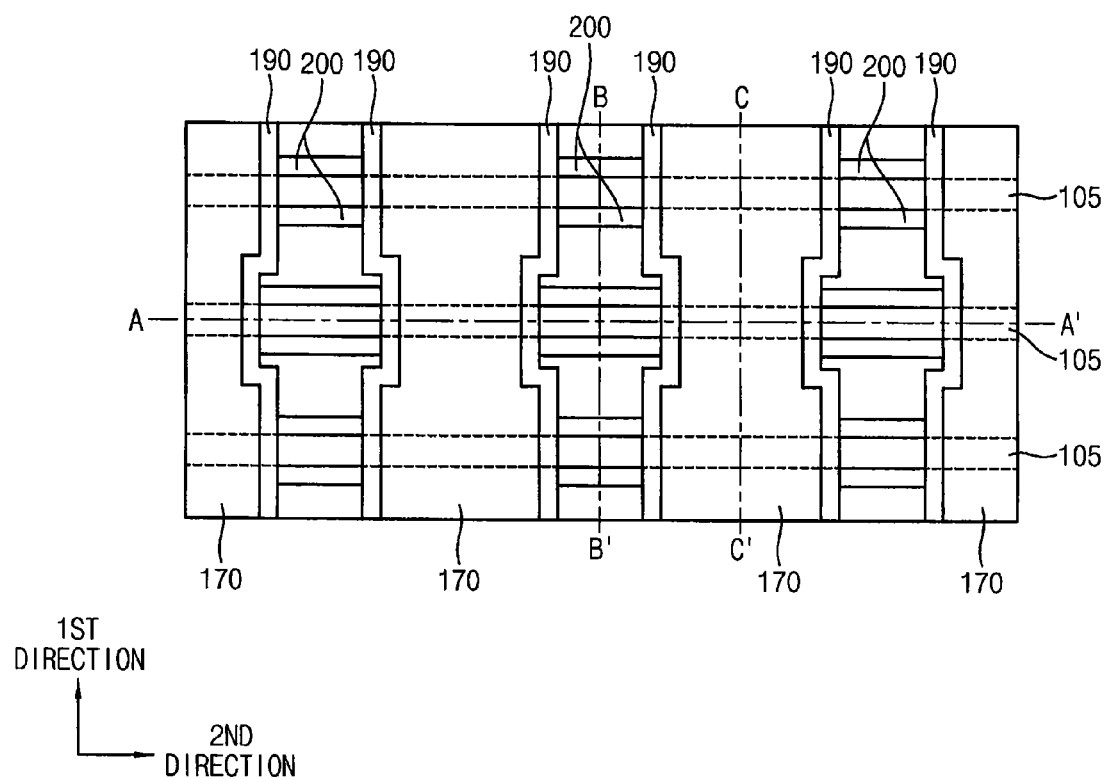
Figure 19:
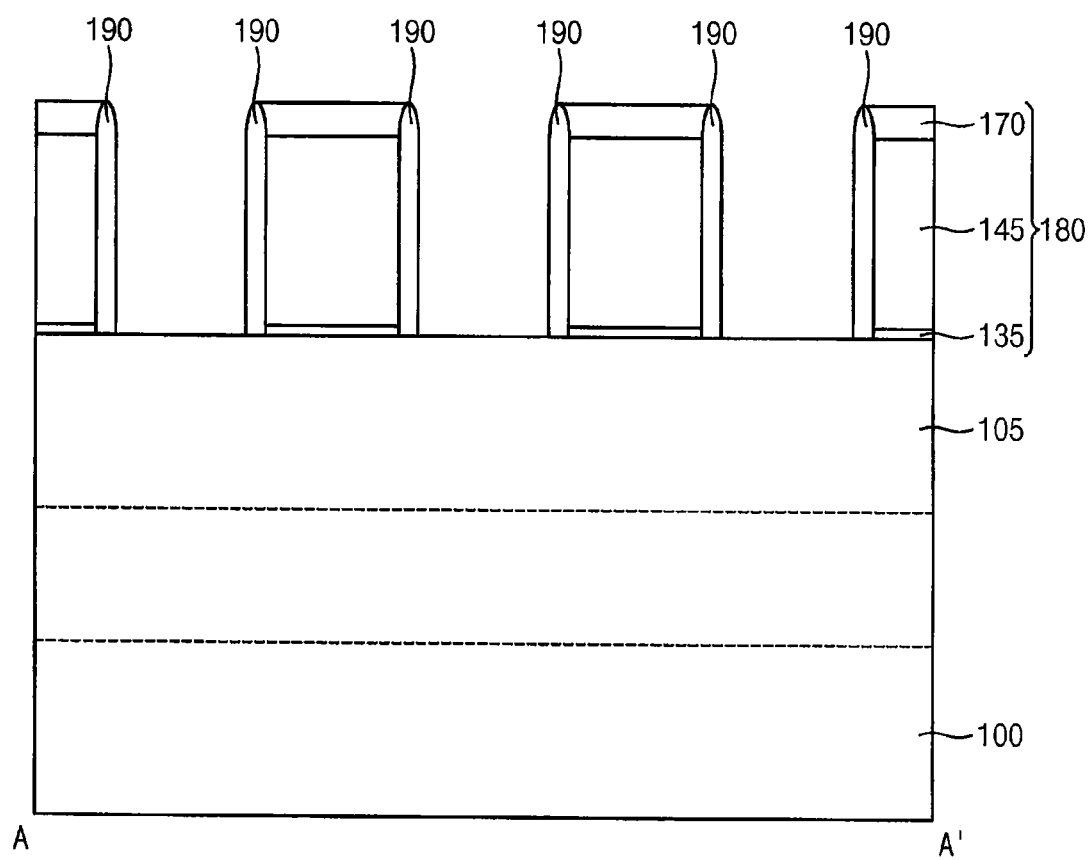
Figure 20:
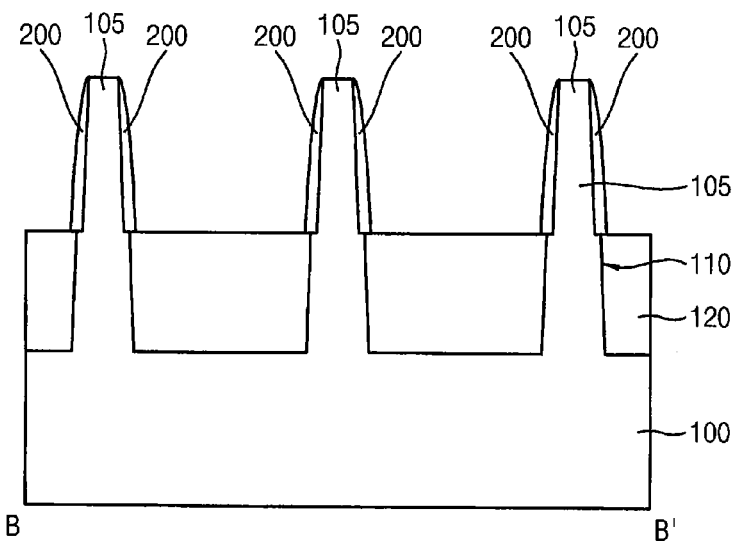

Referring to FIGS. 18 to 20, first and second spacers 190 and 200 may be formed on sidewalls of the dummy gate structures 180 and the active fins 105, respectively. The first spacer 190 may be also referred to as a dummy gate spacer 190.

In example embodiments, the first and second spacers 190 and 200 may be formed by forming a second spacer layer on the dummy gate structures 180, the active fin 105 and the isolation layer pattern 120, and anisotropically etching the second spacer layer. The second spacer layer may include a nitride, e.g., silicon nitride (SiN), silicon oxycarbonitride (SiOCN), or the like.

In example embodiments, the first spacer 190 may be on both sidewalls of each of the dummy gate structures 180 in the second direction, and the second spacer 200 may be on both sidewalls of the active fin 105 in the first direction.

Figure 21:
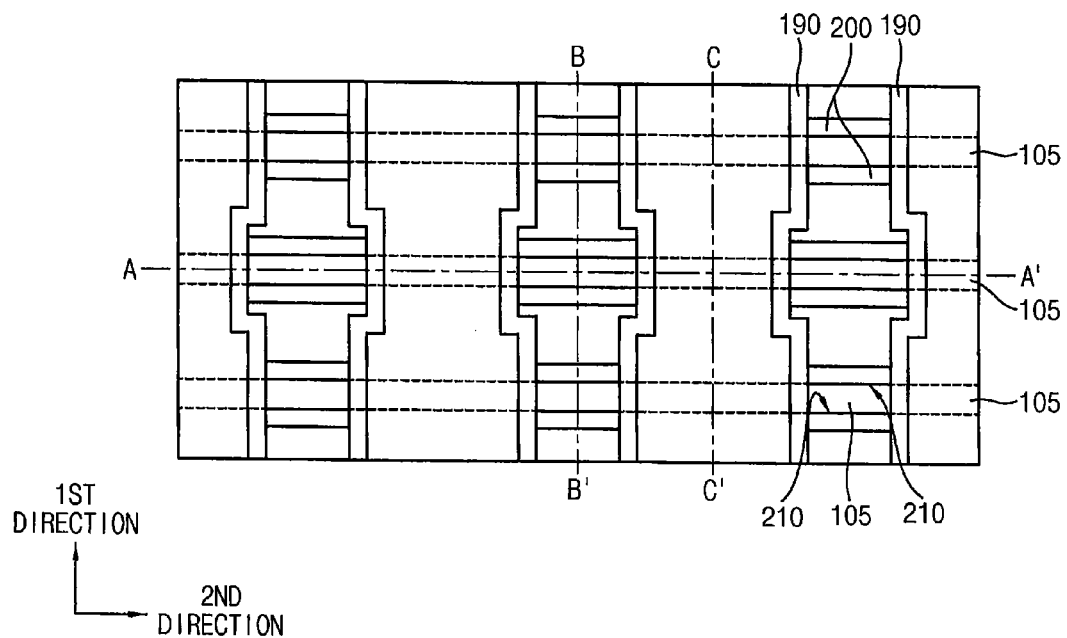
Figure 22:
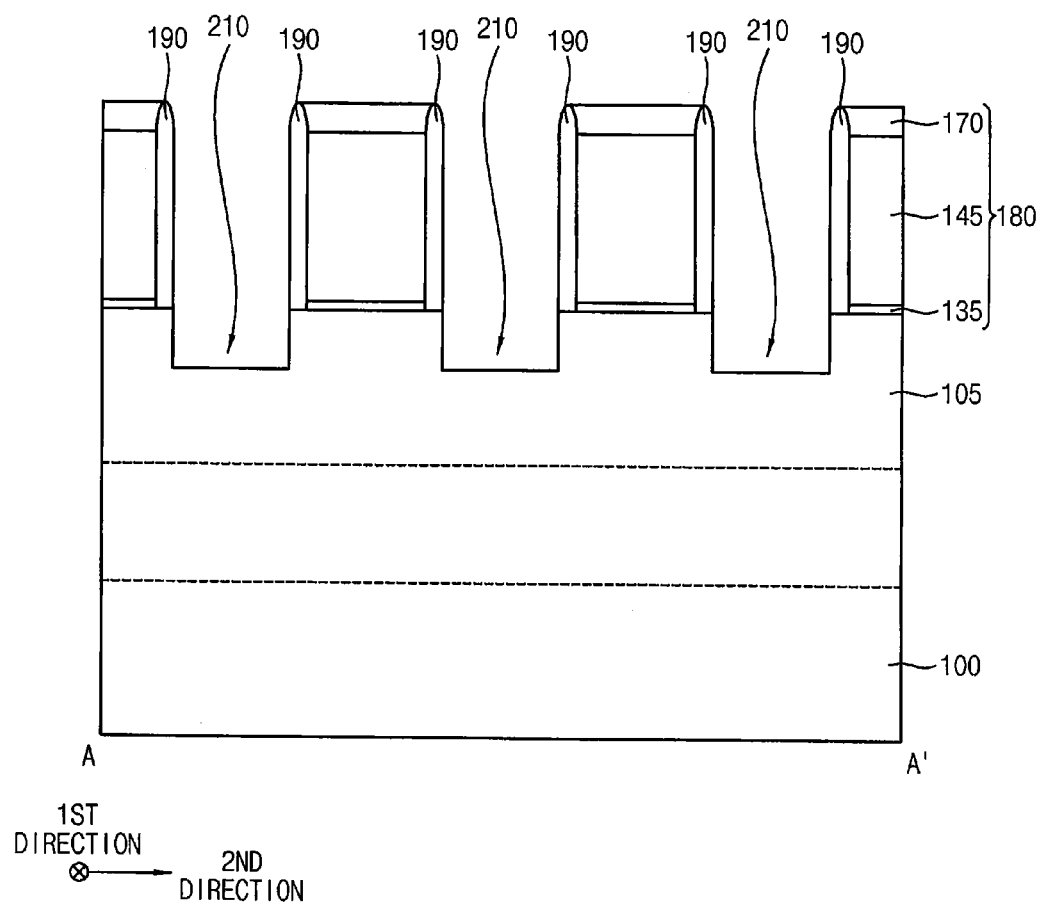
Figure 23:
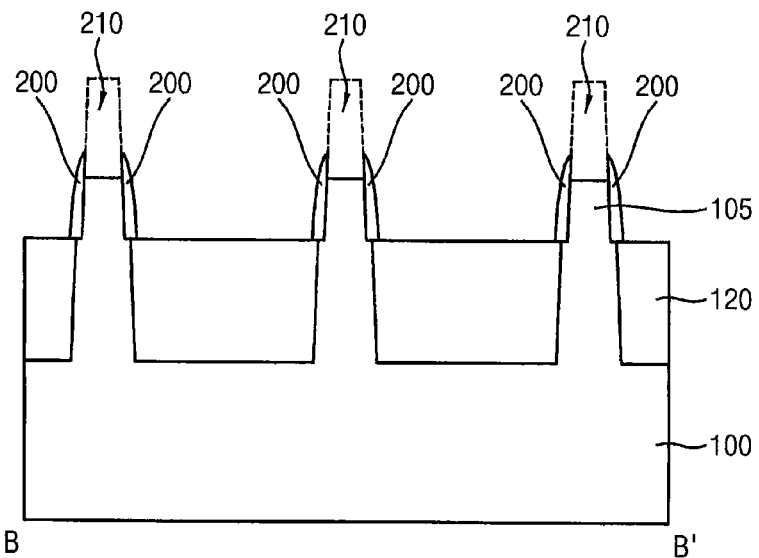

Referring to FIGS. 21 to 23, upper portions of the active fin 105 that are adjacent the dummy gate structures 180 may be etched to form second trenches 210. Particularly, upper portions of the active fin 105 that are not covered by the dummy gate structures 180 and the first spacer 190 may be partially etched using the dummy gate structures 180 and the first spacer 190 as an etching mask to form the second trenches 210.

In the etching process, an upper portion of the second spacer 200 may be also partially removed so that the second spacer 200 may have a top surface lower than that of the initial active fin 105. Hereinafter, a space formed by a top surface of the active fin 105 of which an upper portion has been removed in the etching process, and inner sidewalls of the neighboring second spacers 200 in the first direction before the etching process may be defined as the second trench 210. The second trench 210 may have a given depth toward an inside of the substrate 100, and may have a constant width along the second direction.

FIGS. 21 to 23 show that the second trench 210 is formed at the upper portion of the active fin 105 of which a sidewall may not be covered by the isolation layer pattern 120, however, the inventive concepts are not limited thereto. In some embodiments, the second trench 210 may extend into the lower portion of the active fin 105 of which a sidewall may be covered by the isolation layer pattern 120. FIGS. 21 to 23 show that the second trench 210 may have a cross-section taken along the second direction having a rectangular shape, however, the inventive concepts are not limited thereto. The cross-section of the second trench 210 taken along the second direction may have a U-like shape, a partial circular shape, a sigma-like shape, or the like in other embodiments.

The process for forming the second spacer 200 illustrated with reference to FIGS. 18 to 20 and the process for forming the second trench 210 may be performed in-situ.

Figure 24:
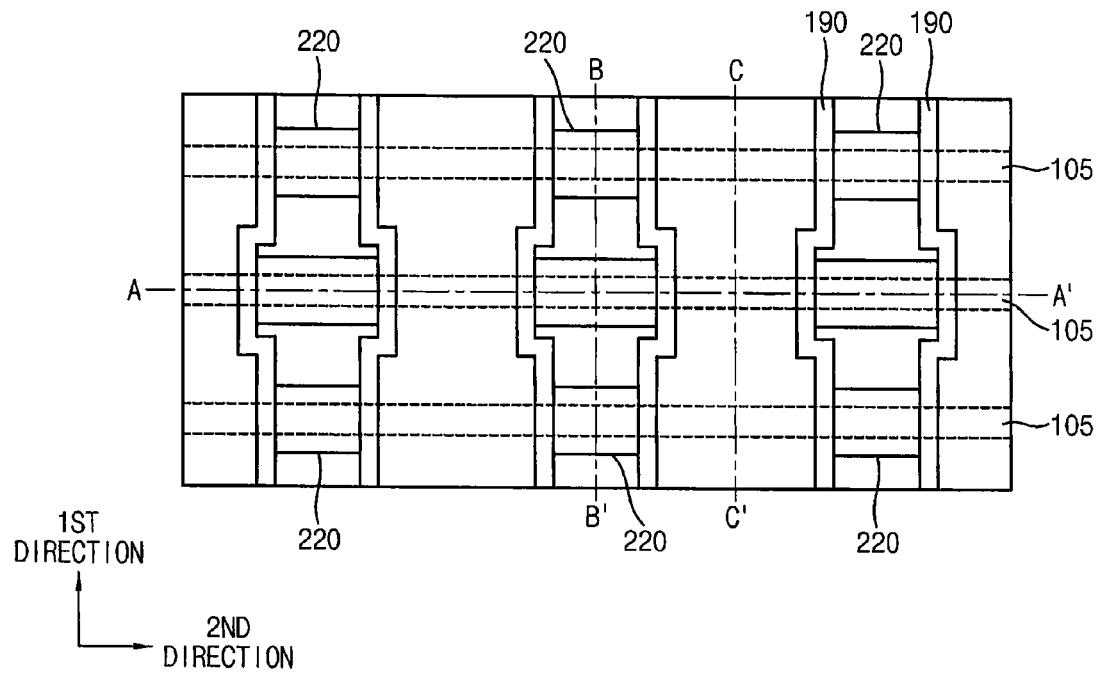
Figure 25:
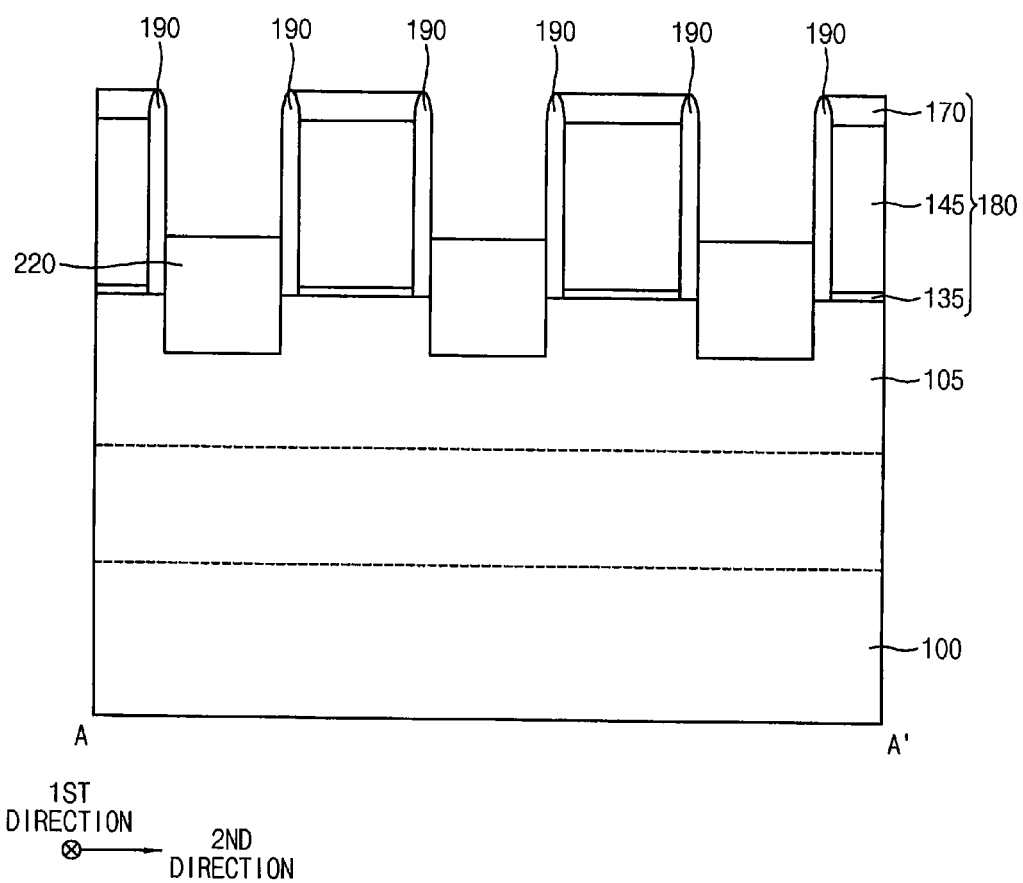
Figure 26:
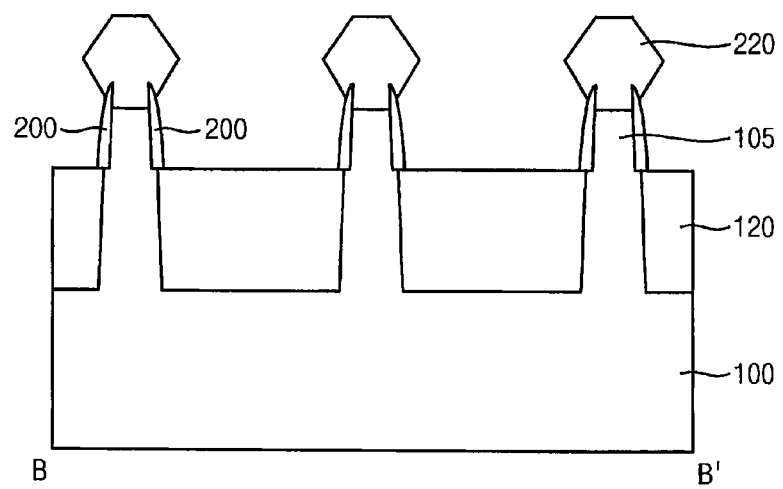
Figure 27:
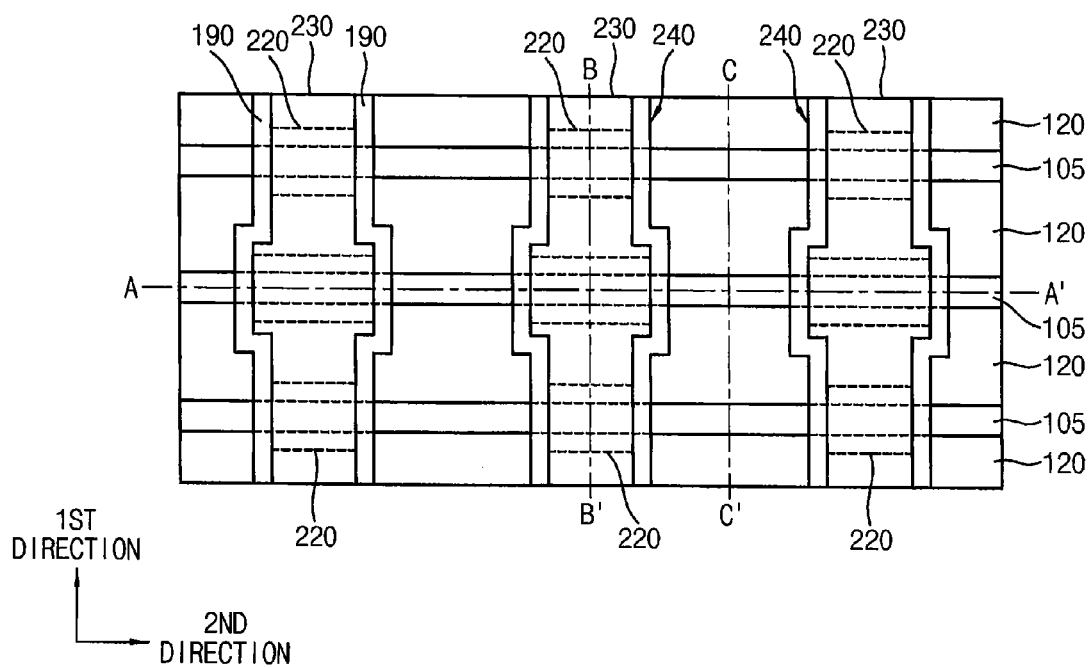
Figure 28:
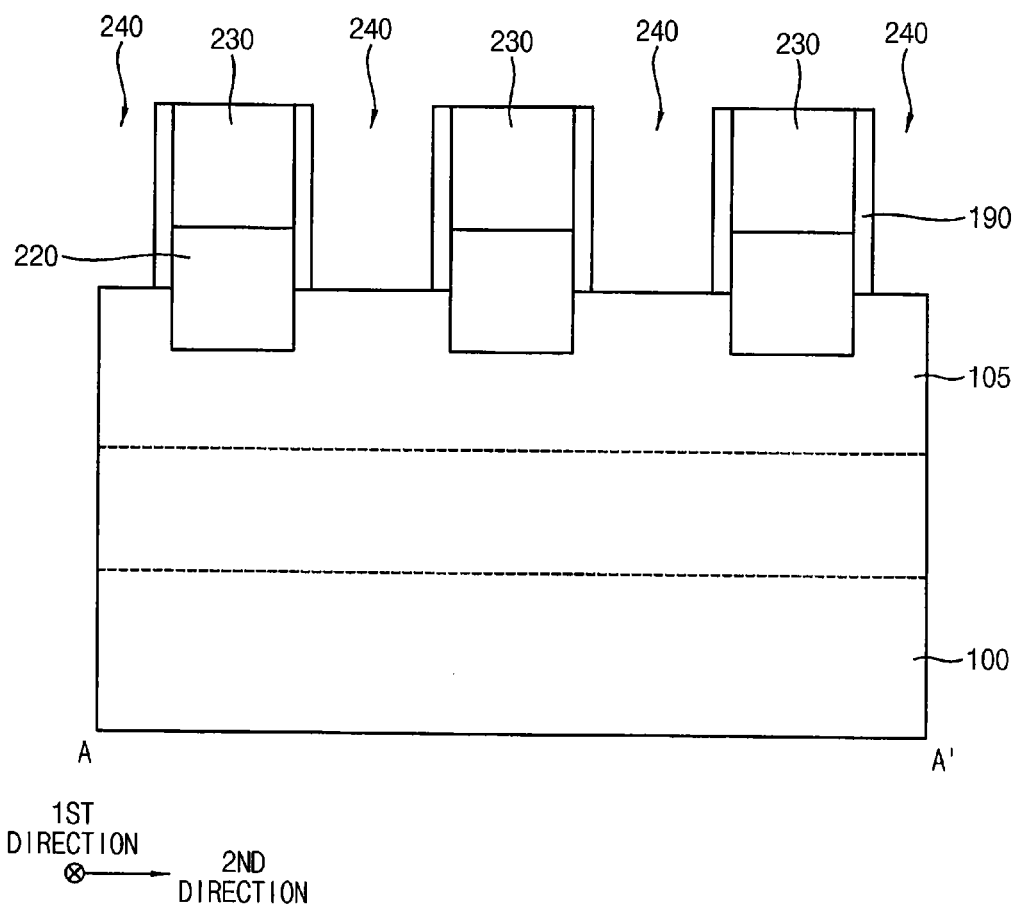
Figure 29:
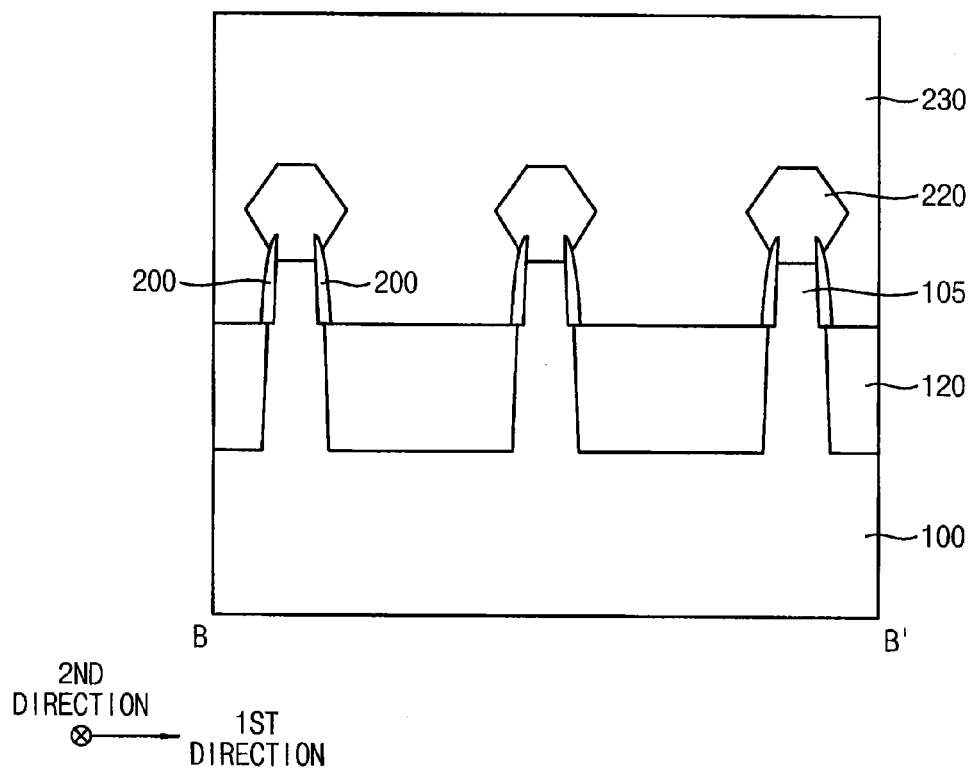

Referring to FIGS. 24 to 26, a source/drain layer 220 may be formed in the second trench 210. The source/drain layer 220 may fill the second trench 210.

In example embodiments, the source/drain layer 220 may be formed by a selective epitaxial growth (SEG) process using a top surface of the active fin 105 that is exposed by the second trench 210 as a seed.

In an example embodiment, the SEG process may be performed using a silicon source gas, e.g., dichlorosilane ($SiH_2Cl_2$) gas, and a germanium source gas, e.g., germane ($GeH_4$) gas so that a single crystalline silicon-germanium layer may be formed. In example embodiments, a p-type impurity source gas, e.g., diborane ($B_2H_6$) gas may also be used to form a single crystalline silicon-germanium layer doped with p-type impurities. Thus, the source/drain layer 220 may serve as a source/drain region of a positive-channel metal oxide semiconductor (PMOS) transistor.

In example embodiments, the source/drain layer 220 may grow both in vertical and horizontal directions, and an upper portion of the source/drain layer 220 may have a cross-section taken along the first direction of which a shape may be a pentagon or hexagon. A top surface of the source/drain layer 220 may be higher than that of the active fin 105, and thus may be referred to as an elevated source/drain (ESD) layer.

In another example embodiment, a SEG process may be performed using a silicon source gas, e.g., disilane ($Si_2H_6$) gas, and a carbon source gas, e.g., monomethylsilane ($SiH_3CH_3$) gas so that a single crystalline silicon carbide layer may be formed. Alternatively, the SEG process may be performed using a silicon source gas, e.g., disilane ($Si_2H_6$) gas so that a single crystalline silicon layer may be formed. In example embodiments, an n-type impurity source gas, e.g., phosphine ($PH_3$) gas may also be used to form a single crystalline silicon carbide layer or a single crystalline silicon layer doped with n-type impurities. Thus, the source/drain layer 220 may serve as a source/drain region of a negative-channel metal oxide semiconductor (NMOS) transistor.

Referring to FIGS. 27 to 30, an insulating interlayer 230 may be formed on the substrate 100 and the isolation layer pattern 120 to cover the dummy gate structures 180, the first and second spacers 190 and 200, and the source/drain layer 220, and may be planarized until top surfaces of the dummy gate electrodes 145 of the dummy gate structures 180 are exposed. The dummy gate masks 170 of the dummy gate structures 180 and an upper portion of the first spacer 190 may be also removed. In example embodiments, the planarization process may be performed by a CMP process and/or an etch back process.

The exposed dummy gate electrodes 145 and the dummy gate insulation layer pattern 135 may be removed to form openings 240 exposing top surfaces of the active fins 105 and portions of the isolation layer pattern 120 adjacent thereto.

In example embodiments, the dummy gate electrodes 145 and the dummy gate insulation layer pattern 135 may be removed by performing a dry etching process first and then a wet etching process. The wet etching process may be performed using hydrogen fluoride (HF) as an etching solution.

Each dummy gate structure 180 may be formed to extend in the first direction and have a width in the second direction that varies along the first direction, and thus each opening 240 that is formed by removing a dummy gate structure 180 may also extend in the first direction and have a width in the second direction that varies along the first direction.

Referring to FIGS. 31 to 34, a gate structure 290 may be formed in each opening 240. In particular, a thermal oxidation process may be performed on the top surfaces of the active fins 105 that are exposed by the openings 240 to form an interface layer pattern 250. Then, a gate insulation layer and a work function control layer may be sequentially formed on the interface layer pattern 250, an inner sidewall of the first spacer 190, and the insulating interlayer 230, and a gate electrode layer may be formed on the work function control layer to sufficiently fill a remaining portion of the openings 240.

In example embodiments, the interface layer pattern 250 may include silicon oxide. The gate insulation layer may include a metal oxide having a high dielectric constant, e.g., hafnium oxide, tantalum oxide, zirconium oxide, or the like. The work function control layer may include a metal nitride or a metal alloy, e.g., titanium nitride, titanium aluminum, titanium aluminum nitride, tantalum nitride, tantalum aluminum nitride, or the like. The gate electrode layer may include a material having a low resistance, e.g., a metal such as aluminum, copper, tantalum, or the like, or doped polysilicon.

In example embodiments, the gate insulation layer, the work function control layer and the gate electrode layer may be formed by a CVD process, a PVD process, an ALD process, or the like. The interface layer pattern 250 may be also formed by a CVD process, a PVD process, an ALD process, or the like, instead of the thermal oxidation process. In this case, the interface layer pattern 250 may be also formed on the inner sidewall of the first spacer as well as on the top surfaces of the active fins 105.

In some embodiments, the interface layer pattern 250 and the work function control layer may be omitted.

The gate electrode layer, the work function control layer, and the gate insulation layer may be planarized until the top surface of the insulating interlayer 230 is exposed to form a gate insulation layer pattern 260 and a work function control layer pattern 270 that are sequentially stacked on a top surface of the interface layer pattern 250 and the inner sidewalls of the first spacers 190, and a gate electrode 280 filling a remaining portion of each opening 240 on the work function control layer pattern 270. Thus, a bottom and a sidewall of the gate electrode 280 may be covered by the work function control layer pattern 270. In example embodiments, the planarization process may be performed by a CMP process and/or an etch back process.

The sequentially stacked interface layer pattern 250, the gate insulation layer pattern 260, the work function control layer pattern 270, and the gate electrode 280 may form the gate structure 290, and the gate structure 290 and the source/drain region 220 adjacent thereto may form a PMOS transistor or an NMOS transistor.

Each opening 240 may be formed to extend in the first direction and have a width in the second direction that varies along the first direction, and thus each gate structure 290 filling each opening 240 may be also extend in the first direction and have a width in the second direction that varies along the first direction. That is, each gate structure 290 may have the sixth width W6 in the second direction at the first region I, and the fifth width W5 in the second direction that is greater than the sixth width W6 at the second region II. In example embodiments, a plurality of first regions I may be formed in the first direction, and the sixth widths W6 at the first regions I may be different from each other in some embodiments.

Accordingly, each gate structure 290 may have different widths on the plurality of active fins 105 disposed in the first direction, which may be used for controlling a resistance of each gate structure 290.

An additional insulating interlayer (not shown) that covers the transistors may be formed, and contact plugs (not shown) and wirings (not shown) may be formed through the additional insulating interlayer to electrically connect to the source/drain layer 220 or the gate structure 290.

As illustrated above, in the method of manufacturing the semiconductor device, the offset bias may be applied to a specific region of the initial mask layout 50 for forming patterns using the marker, and thus the final mask layouts 52 and/or 54 each having different widths according to regions may be designed. The mask layer 150 may be patterned using the final mask layouts 52 and/or 54 so that the real mask 155 having different widths according to regions may be easily formed with no additional etching mask.

Additionally, the dummy gate mask 170 may be formed between the spacers 160 on the sidewalls of the mask 155 and the dummy gate layer structure may be patterned using the dummy gate mask 170 as an etching mask to form the dummy gate structure 180 having different widths according to regions. The dummy gate structure 180 may be replaced with the gate structure 290, so that the gate structure 290 having different widths according to regions may be easily formed, and the resistance of the transistor including the gate structure 290 may be easily controlled.

In the description above, embodiments have been described in which a dummy gate structure 180 is formed and replaced with the gate structure 290, however, the inventive concepts are not limited thereto. That is, instead of sequentially forming the dummy gate insulation layer 130 and the dummy gate electrode layer 140 on the active fin 105 and the isolation layer pattern 120, the gate insulation layer and the gate electrode layer may be sequentially formed, a gate mask may be formed using the masks 155 and the spacers 160, and the gate insulation layer and the gate insulation layer may be sequentially patterned using the gate mask as an etching mask to form a gate structure.

The above methods of manufacturing semiconductor devices may be applied to methods of manufacturing various types of memory devices and systems including a gate structure. For example, the method may be applied to logic devices such as central processing units (CPUs), main processing units (MPUs), or application processors (APs), or the like. Additionally, the method may be applied to volatile memory devices such as DRAM devices or SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming an isolation layer pattern on a substrate to define an active fin protruding from the isolation layer pattern;
    sequentially forming a dummy gate layer structure and a mask layer on the active fin and the isolation layer pattern;
    patterning the mask layer to form a plurality of masks, each of the masks extending in a first direction;
    forming spacers on opposed sidewalls of each mask;
    forming a dummy gate mask between the spacers;
    patterning the dummy gate layer structure using the dummy gate mask as an etching mask to form a plurality of dummy gate structures, each of the dummy gate structures extending in the first direction; and
    replacing the dummy gate structure with a gate structure,
    wherein patterning the mask layer to form the plurality of masks includes:
        designing a plurality of initial mask layouts, each extending in the first direction;
        providing an offset bias in a second direction that is substantially perpendicular to the first direction for specific regions of respective ones of at least some of the initial mask layouts using a marker to design a plurality of final mask layouts, each having a width in the second direction that varies along the first direction; and
        patterning the mask layer according to the final mask layouts to form the plurality of masks, each of the plurality of masks having a width in the second direction that varies along the first direction.

2. The method of claim 1, wherein each spacer has a width in the second direction that is constant along the first direction.

3. The method of claim 2, wherein each dummy gate mask has a width in the second direction that varies along the first direction.

4. The method of claim 3, wherein each dummy gate structure has a width in the second direction that varies along the first direction.

5. The method of claim 4, wherein each gate structure has a width in the second direction that varies along the first direction.

6. The method of claim 4, wherein the active fin comprises one of a plurality of active fins that are formed, each active fin extending in the second direction so that each dummy gate structure crosses over the plurality of active fins, and
    wherein a first portion of a first of the dummy gate structures that crosses over a first of the plurality of active fins has a first width in the second direction and a second portion of the first of the dummy gate structures that crosses over a second of the plurality of active fins has a second width in the second direction that is different than the first width.

7. The method of claim 1, wherein providing the offset bias for specific regions of respective ones of at least some of the initial mask layouts to design the plurality of final mask layouts comprises providing a positive offset bias in the second direction for first regions of at least some of the initial mask layouts to design the plurality of final mask layouts, each having a width in the second direction at the respective first regions that is greater than a width in the second direction at a respective second region that is adjacent the first region.

8. The method of claim 1, wherein providing the offset bias for specific regions of respective ones of at least some of the initial mask layouts to design the plurality of final mask layouts comprises providing a negative offset bias in the second direction for first regions of at least some of the initial mask layouts to design the plurality of final mask layouts, each having a width in the second direction at the respective first regions that is less than a width in the second direction at a respective second region that is adjacent the first region.

9. The method of claim 1, further comprising removing the masks and the spacers, after forming the dummy gate mask between the spacers.

10. The method of claim 1, wherein forming the dummy gate layer structure on the active fin and the isolation layer pattern includes forming a dummy gate insulation layer and a dummy gate electrode layer sequentially stacked on the active fin and the isolation layer pattern.

11. The method of claim 10, wherein each dummy gate structure includes a dummy gate insulation layer pattern, a dummy gate electrode and a dummy gate mask that are sequentially stacked on the active fin and the isolation layer pattern.

12. The method of claim 11, further comprising, after forming the dummy gate structures, forming dummy gate spacers on opposed sidewalls of each dummy gate structure,
    and further comprising, prior to replacing the dummy gate structures with the gate structures:
        forming an insulating interlayer on the active fin and the isolation layer pattern to cover the dummy gate structures and the dummy gate spacers; and
        planarizing the insulating interlayer, the dummy gate mask and the dummy gate spacers until the dummy gate electrode is exposed.

13. The method of claim 12, wherein replacing the dummy gate structures with the gate structures includes:
    removing the exposed dummy gate electrode and the dummy gate insulation layer pattern thereunder to form an opening exposing a top surface of the active fin;
    forming a gate insulation layer pattern on the exposed top surface of the active fin and a sidewall of the opening; and
    forming a gate electrode on the gate insulation layer pattern.

14. A method of manufacturing a semiconductor device, the method comprising:
    forming an isolation layer pattern on a substrate to define an active fin protruding from the isolation layer pattern;
    sequentially forming a gate layer structure and a mask layer on the active fin and the isolation layer pattern;
    patterning the mask layer to form a plurality of masks, each extending in a first direction;
    forming spacers on opposed sidewalls of each mask;
    forming a gate mask between the spacers; and
    patterning the gate layer structure using the gate mask as an etching mask to form a plurality of gate structures, each of the gate structures extending in the first direction,
    wherein patterning the mask layer to form the plurality of masks includes:
        designing a plurality of initial mask layouts, each extending in the first direction;
        providing an offset bias in a second direction substantially perpendicular to the first direction for first regions of at least some of the initial mask layouts using a marker to design a plurality of final mask layouts, each having a width in the second direction at the respective first regions that is different from a width in the second direction at respective second regions that are adjacent the corresponding first regions along the first direction; and patterning the mask layer according to the final mask layouts.

15. The method of claim 14, wherein each spacer has a width in the second direction that is constant along the first direction, and
   wherein a portion of the gate mask that is adjacent the first region of each mask has a width in the second direction that is different from a width in the second direction of a portion of the gate mask that is adjacent the second region of each mask.

16. A method of manufacturing a semiconductor device, the method comprising:
   designing a plurality of initial mask layouts, each initial mask layout extending in a first direction and having a substantially constant width in a second direction that is substantially perpendicular to the first direction;
   assigning an offset bias in the second direction for at least one region of at least some of the initial mask layouts to provide a plurality of final mask layouts, each of the final mask layouts extending in the first direction and at least some of the final mask layouts having a width in the second direction that varies along the first direction;
   forming a first layer structure on a substrate;
   forming a mask layer on the first layer structure;
   patterning the mask layer using the final mask layouts to form a plurality of first masks that extend in the first direction, wherein at least some of the first masks have a width in the second direction that varies along the first direction;
   forming spacers on opposed sidewalls of each of the plurality of first masks;
   forming a plurality of second masks, each second mask being formed in between a respective pair of adjacent ones of the first masks; and
   patterning the first layer structure using the second masks as an etching mask to form a plurality of structures that extend in the first direction and that have a width in the second direction that varies along the first direction.

17. The method of claim 16, wherein the first layer structure is a dummy gate layer structure, and wherein the dummy gate layer structure is formed on a plurality of active fins that extend upwardly from the substrate and a plurality of isolation patterns that are between adjacent ones of the active fins, the active fins extending in the second direction and protruding above the isolation patterns.

18. The method of claim 16, wherein the first layer structure is a gate layer structure, and wherein the gate layer structure is formed on a plurality of active fins that extend upwardly from the substrate and a plurality of isolation patterns that are between adjacent ones of the active fins, the active fins extending in the second direction and protruding above the isolation patterns.

19. The method of claim 16, wherein the offset bias comprises a first offset bias and the at least one region comprises a first region, and wherein for a first of the initial mask layouts, a non-zero second offset bias that is different than the first offset bias is assigned in the second direction for a second region so that the final mask layout includes a first mask layout that has a first region having the offset bias, a second region having the second offset bias and a third region that has no offset bias.

20. The method of claim 16, wherein each spacer has a width in the second direction that is constant along the first direction.

* * * * *